US009975133B2

(12) United States Patent
Kobayashi et al.

(10) Patent No.: US 9,975,133 B2
(45) Date of Patent: May 22, 2018

(54) VAPOR DEPOSITION DEVICE AND VAPOR DEPOSITION METHOD

(71) Applicant: Sharp Kabushiki Kaisha, Sakai, Osaka (JP)

(72) Inventors: Yuhki Kobayashi, Sakai (JP); Shinichi Kawato, Sakai (JP); Manabu Niboshi, Sakai (JP); Kazuo Takizawa, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days. days.

(21) Appl. No.: 15/548,258

(22) PCT Filed: Jan. 27, 2016

(86) PCT No.: PCT/JP2016/052283
§ 371 (c)(1),
(2) Date: Aug. 2, 2017

(87) PCT Pub. No.: WO2016/125648
PCT Pub. Date: Aug. 11, 2016

(65) Prior Publication Data
US 2018/0015493 A1 Jan. 18, 2018

(30) Foreign Application Priority Data
Feb. 3, 2015 (JP) .................................. 2015-019550

(51) Int. Cl.
*H01L 51/00* (2006.01)
*B05B 15/04* (2006.01)
*C23C 14/04* (2006.01)
*H01L 51/50* (2006.01)
*C23C 14/24* (2006.01)

(52) U.S. Cl.
CPC ............ *B05B 12/20* (2018.02); *B05B 15/045* (2013.01); *C23C 14/042* (2013.01); *C23C 14/24* (2013.01); *H01L 51/0002* (2013.01); *H01L 51/5012* (2013.01)

(58) Field of Classification Search
CPC . H01L 51/0002; H01L 51/5012; B05B 12/20; B05B 15/045
See application file for complete search history.

(56) References Cited

U.S. PATENT DOCUMENTS

2012/0237682 A1* 9/2012 Hong .................... C23C 14/042
427/282
2016/0301006 A1* 10/2016 Obata .................. H01L 51/0011

FOREIGN PATENT DOCUMENTS

| JP | H06-51905 B2 | 7/1994 |
| JP | 2002-75638 A | 3/2002 |
| JP | 2002-75639 A | 3/2002 |
| JP | 2004-146251 A | 5/2004 |

* cited by examiner

*Primary Examiner* — Douglas Menz
(74) *Attorney, Agent, or Firm* — ScienBiziP, P.C.

(57) ABSTRACT

In plan view, a magnet plate (10) has a first magnetic domain (11) and a second magnetic domain (12), a magnetic domain boundary line (14) is inclined to an opening side (26) and is bent or curved, and the magnet plate has magnetic fields that are generated in a respective plurality of different directions.

12 Claims, 12 Drawing Sheets

(a)

(b)

(a)

(b)

(a)

(b)

(a)

(b)

(c)

VAPOR DEPOSITION DEVICE AND VAPOR DEPOSITION METHOD

TECHNICAL FIELD

The present invention relates to a vapor deposition device and a vapor deposition method.

BACKGROUND ART

Recent years have witnessed practical use of a flat-panel display in various products and fields. This has led to a demand for a flat-panel display that is larger in size, achieves higher image quality, and consumes less electric power.

Under such circumstances, great attention has been drawn to an electroluminescent (hereinafter abbreviated to "EL") display device that (i) includes an EL element which uses electroluminescence (hereinafter abbreviated to "EL") of an organic or inorganic material and that (ii) is an all-solid-state flat-panel display which is excellent in, for example, low voltage driving, high-speed response, and self-emitting characteristic.

In order to achieve a full-color display, an EL display device includes a luminescent layer which outputs light of a desired color in correspondence with a plurality of sub-pixels constituting a pixel.

A luminescent, layer is formed as a vapor-deposited film on a film formation target substrate. Specifically, in a vapor deposition process, a fine metal mask (FMM) having high-accuracy openings is used as a vapor deposition mask, and differing vapor deposition particles are selectively vapor deposited to each region of the film formation target substrate.

According to a conventional vapor deposition method, vapor deposition particles emitted from a vapor deposition source are vapor deposited on a film formation target substrate via openings of a vapor deposition mask while the film formation target substrate and the vapor deposition mask, which has the openings, are in close contact with each other. With the arrangement, in correspondence with where the openings are located, a vapor-deposited film is formed, as a luminescent layer that emits light of a corresponding one of red, green, and blue, in each of a red sub-pixel region, a green sub-pixel region, and a blue sub-pixel region.

Note, however, that vapor deposition carried out while a film formation target substrate and a vapor deposition mask are separated from each other causes a deterioration in accuracy of a vapor deposition pattern, so that an EL display device has a lower display quality. Specifically, vapor deposition particles that enter and pass through an opening at an angle, which is smaller than a given angle, with respect to a surface of the vapor deposition mask are scattered in a region outside a green sub-pixel region that is supposed to be subjected to vapor deposition. This causes a position at which a luminescent layer is to be formed to be displaced from a position at which a film formation pattern is supposed to be located, so that a so-called film formation blur occurs. Further, part of the vapor deposition particles which are scattered in the region outside the green sub-pixel region that is supposed to be subjected to vapor deposition reach a red sub-pixel region, which is adjacent to the green sub-pixel region. This causes a luminescent layer that emits green light to be formed in the red sub-pixel region, so that color mixture occurs in the red sub-pixel region.

In order to solve such a problem, there is known a technique in which a mask containing ferromagnetic metal is used, a vapor deposition mask is attracted by a magnetic force by providing a magnet on a first side of the film formation target substrate which first side is opposite from a second side of the film formation target substrate on which second side the vapor deposition mask is provided, and vapor deposition is carried out while the film formation target substrate and the vapor deposition mask are in close contact with each other.

(a) of FIG. 15 is a plan view of a vapor deposition mask that is used in a conventional vapor deposition device, (b) of FIG. 15 is a plan view of a magnet and a vapor deposition mask that are seen from the vapor deposition mask side while being provided so as to face each other, (c) of FIG. 15 is a cross-sectional view taken along the line C-C of (b) of FIG. 15.

According to a conventional vapor deposition device, for example, a metallic mask 620 provided with a plurality of slit openings 622 (see (a) of FIG. 15) is used to cause a magnet 610 and the metallic mask 620 to face each other via a film formation target substrate (not illustrated) (see (c) of FIG. 15). This allows the film formation target substrate and the vapor deposition mask to be in close contact with each other by a magnetic force.

In this case, the magnet 610 is provided so that a surface of a single magnetic pole (in the example of FIG. 15, an S pole 611N) faces one surface of the metallic mask 620. This causes the entirety of the one surface of the metallic mask 620 to be polarized so as to be magnetized to a single magnetic pole. Specifically, the one surface of the metallic mask 620 is magnetized to an S pole, whereas the other surface of the metallic mask 620 is magnetized to an N pole.

As a result, as illustrated in (b) of FIG. 15, regions between adjacent openings 622 are magnetized to the N pole, and repulsive forces generated between the regions repel each other, so that the openings 622 are deformed. Vapor deposition carried out by use of the metallic mask 620 in which the openings 622 have been deformed causes a deterioration in accuracy of a vapor deposition pattern, so that poor light emission such as uneven light emission in a pixel or color mixed light emission occurs in an organic EL display device.

As a countermeasure against the above problem, Patent Literature 1 discloses the following. Specifically, assume that a metallic mask is brought into close contact, by a magnetic force, with a vapor deposition target substrate which is provided with an organic film, and a state of contact between the metallic mask and the vapor deposition target substrate is maintained so that vapor deposition particles are vapor deposited on the organic film. In this case, by causing an adsorbability, depending on a magnet, of the metallic mask with respect to the vapor deposition target substrate to fall within a range of 0.98 kPa to 98 kPa, a long mask pattern such as a slit can be prevented from being deformed by a magnetic force.

Patent Literatures 2 through 4 disclose that a magnet for use in a vapor deposition device is exemplified by a magnet that has a plurality of magnetic domains on its surface which is in contact with a vapor deposition target substrate, the plurality of magnetic domains being arranged so that adjacent magnetic domains thereof differ in polarity.

According to a patterning device of Patent Literature 4, a magnetized member in which magnetic domains that differ from each other in polarity are alternately arranged in plan view is used to cause a long side of an opening of a metallic mask and a long side of a magnetic domain of the magnetized member to be at substantially right angles, so that the metallic mask and the magnetized member face each other via a film formation target substrate.

With the arrangement, regions between adjacent openings include a region that is magnetized to the N pole and a region that is magnetized to the S pole. Thus, in a case where a repulsive force and an attractive force that are applied to a space between the regions are offset, it is possible to prevent a change in shape of an opening (mask strain).

CITATION LIST

Patent Literatures

[Patent Literature 1]
Japanese Patent Application Publication Tokukai No. 2002-75638 (Publication date: Mar. 15, 2002)
[Patent Literature 2]
Japanese Patent Application Publication Tokukaihei No. 6-51905 (Publication date: Jul. 6, 1994)
[Patent Literature 3]
Japanese Patent Application Publication Tokukai No. 2004-146251 (Publication date: May 20, 2004)
[Patent Literature 4]
Japanese Patent Application Publication Tokukai No. 2002-75639 (Publication date: Mar. 15, 2002)

SUMMARY OF INVENTION

Technical Problem

Note, however, that since a method of Patent Literature 1 is arranged to prevent mask strain in a mask pattern, due to a magnetic force merely by limiting an adsorbability depending on a magnet, the adsorbability may be insufficient depending on design matters such as the dimensions and the weight of a mask and a film formation target substrate, and consequently a vapor deposition pattern may have lower accuracy.

According to vapor deposition methods disclosed in Patent Literatures 2 through 4, since a boundary line between magnetic domains is a straight line, a magnetized member has, on its surface, only a magnetic field that is generated in one direction. As a result, regions of a metallic mask to which regions a load is applied are concentrated on the straight line, so that the metallic mask is bent. Meanwhile, in a case where a composite mask of a metallic layer and a resin layer is used instead of the metallic mask, mask damage such as peeling-off of the metallic layer occurs.

Further, according to the vapor deposition methods disclosed in Patent Literatures 2 through 4, in a case where a metallic mask having a slotted opening is used, regions that face each other across the opening may be magnetized to a single magnetic pole depending on a positional relationship between a magnetic domain and the opening. As a result, repulsive forces are generated between the regions, and the repulsive forces repel each other, so that mask strain occurs.

Patent Literature 4 discloses, as another example of the patterning device, a patterning device that includes a magnetized member in which a boundary line between magnetic domains is not parallel to but is inclined to opening sides of a slotted opening. Note, however, that the boundary line between the magnetic domains, which boundary line is linear, causes mask damage. Further, magnetic reversal occurs only in one direction. In a case where a direction of magnetic reversal is subjected to vector resolution into two directions in which the opening sides of the opening extend, magnetic reversal occurs only in a direction in which a short side of the opening extends. In a case where magnetic reversal occurs only in the direction in which the short side of the opening sides extends, mask strain may by caused by a magnetic field that is generated in the direction in which the short side of the opening sides extends.

Patent Literature 4 discloses, as still another example of the patterning device, a patterning device that includes a magnetized member in which a plurality of magnetic domains is arranged in a matrix pattern in plan view so as to be checkered. In this case, magnetic reversal occurs only in two directions. In particular, local magnetic reversal occurs only in a direction in which a short side of an opening extends. This may cause mask strain.

The present invention has been made in view of the problems, and an object of the present invention is to provide a vapor deposition device and a vapor deposition method each of which allows prevention of (i) mask strain caused by magnetization of a mask and (ii) mask damage.

Solution to Problem

In order to attain the object, a vapor deposition device in accordance with an aspect of the present invention includes: a vapor deposition mask having at least one opening; and a magnetic force generating source for attracting the vapor deposition mask thereto by a magnetic force via a film formation target substrate, provided between the vapor deposition mask and the magnetic force generating source, so as to adsorb the vapor deposition mask onto the film formation target substrate, the magnetic force generating source having a plurality of magnetic domains in plan view, the plurality of magnetic domains including adjacent magnetic domains that have at least one boundary line therebetween, the at least one boundary line being inclined to an opening side of the at least one opening and being bent or curved, and the magnetic force generating source having magnetic fields that are generated in a respective plurality of different directions in plan view.

Advantageous Effects of Invention

An aspect of the present invention makes it possible to provide a vapor deposition device and a vapor deposition method each of which allows prevention of (i) mask strain caused by magnetization of a mask and (ii) mask damage.

BRIEF DESCRIPTION OF DRAWINGS (a) of FIG. 1 is a plan view of a surface of a magnet plate of a vapor deposition device in accordance with Embodiment 1 of the present invention which surface faces a vapor deposition mask. (b) of FIG. 1 is a plan view of the vapor deposition mask. (c) of FIG. 1 is a plan view of the magnet plate and the vapor deposition mask which are seen from the vapor deposition mask side while being provided so as to face each other. (d) of FIG. 1 is a cross-sectional view taken along the line A-A of (c) of FIG. 1. (e) of FIG. 1 is a cross-sectional view taken along the line B-B of (c) of FIG. 1.

FIG. 2 is a perspective view illustrating an arrangement of a main part of the vapor deposition device in accordance with Embodiment 1 of the present invention.

(a) of FIG. 3 is a plan view illustrating a direction in which a magnetic field is generated in a magnet plate of a conventional vapor deposition device. (b) of FIG. 3 is a plan view illustrating a direction in which a magnetic field is generated in the magnet plate of the vapor deposition device in accordance with Embodiment 1 of the present invention.

(a) of FIG. 4 is a plan view showing another arrangement example of the magnet plate. (b) of FIG. 4 is a plan view illustrating a direction in which a magnetic field is generated in the magnet plate of the another arrangement example.

Figure 8:
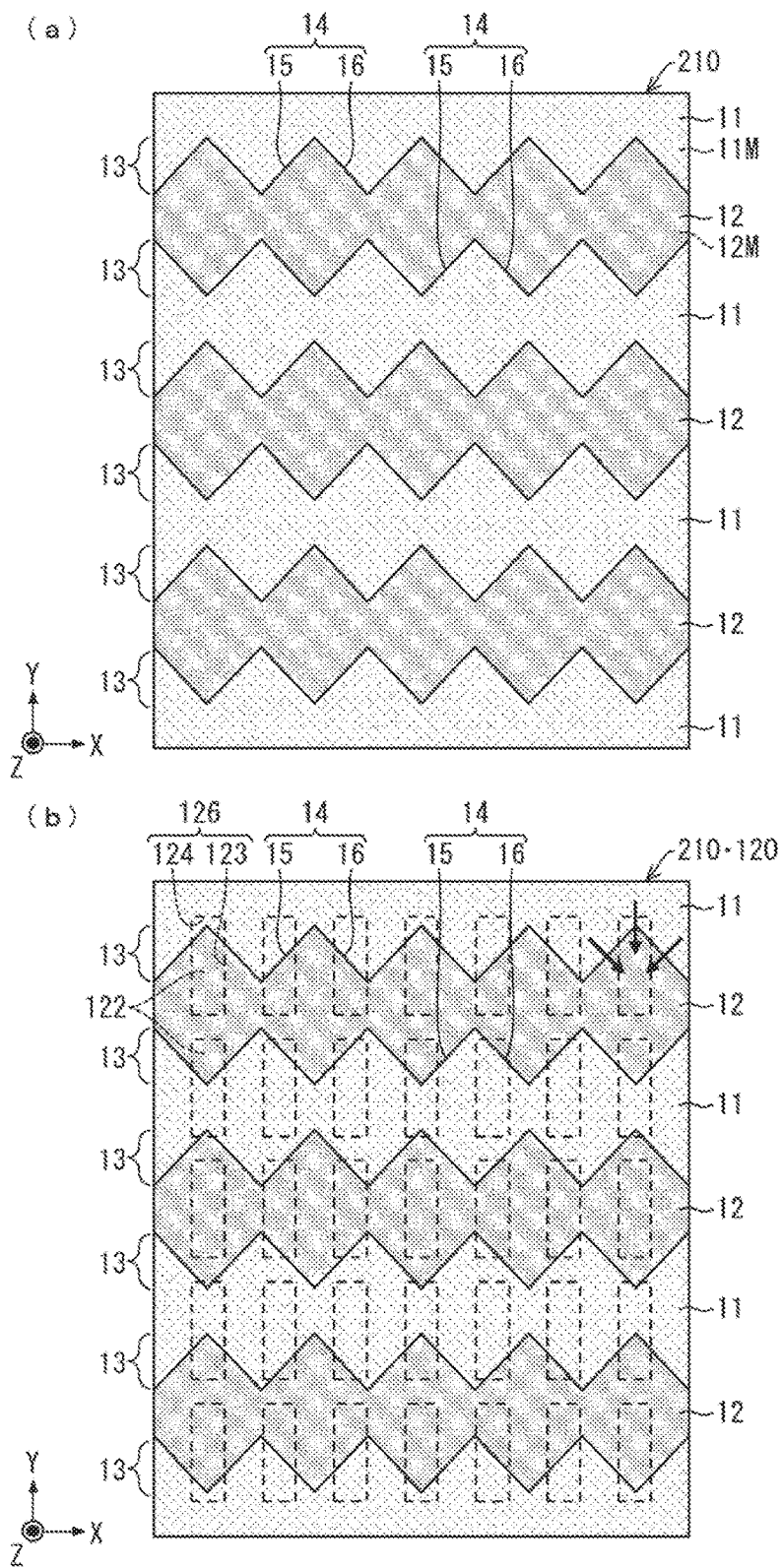

(a) of FIG. 8 is a plan view of a magnet plate of a vapor deposition device in accordance with Embodiment 2 of the present invention. (b) of FIG. 8 is a plan view of the magnet plate and a vapor deposition mask which are seen from to the vapor deposition mask side while being provided so as to face each other.

Figure 9:
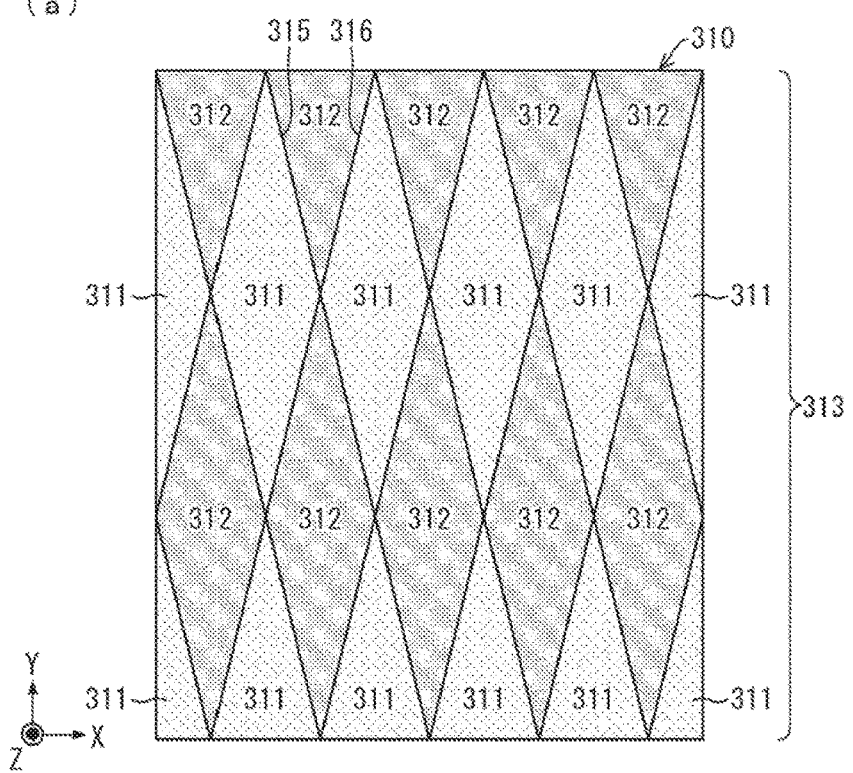
Figure 9:
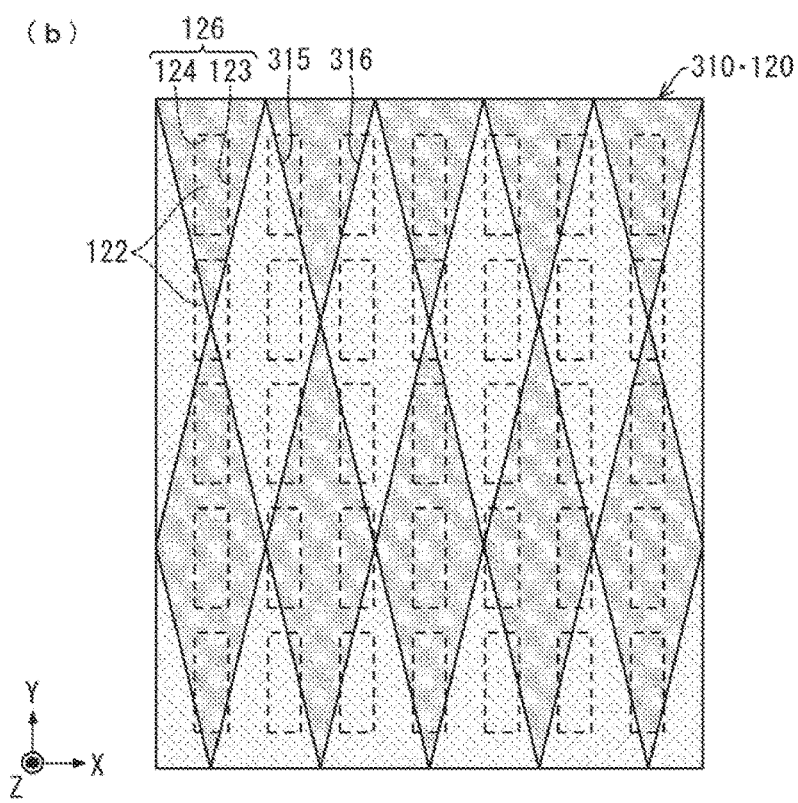

(a) of FIG. 9 is a plan view of a magnet plate of a vapor deposition device in accordance with Embodiment 3 of the present invention. (b) of FIG. 9 is a plan view of the magnet plate and a vapor deposition mask which are seen from the vapor deposition mask side while being provided so as to face each other.

Figure 10:
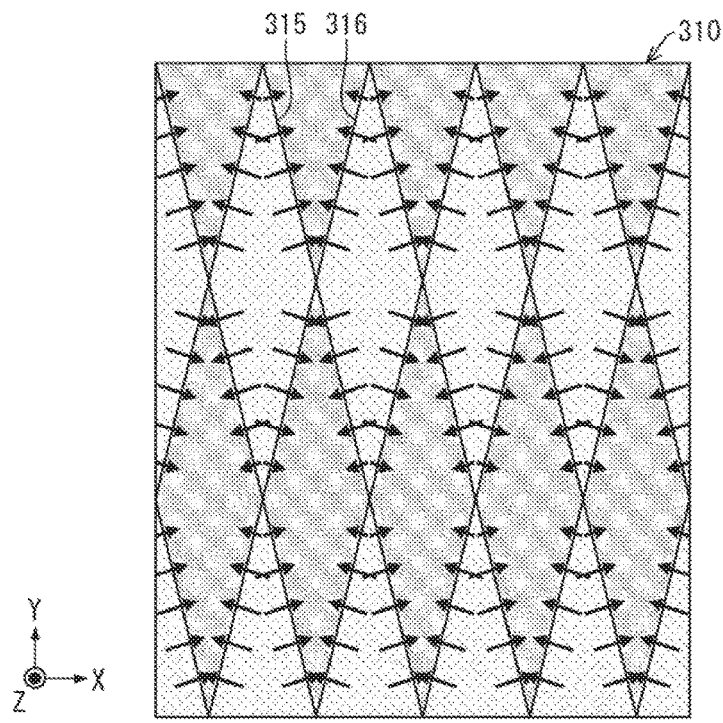

FIG. 10 is a plan view illustrating a direction in which a magnetic field is generated in the magnet plate of the vapor deposition device in accordance with Embodiment 3 of the present invention.

Figure 11:
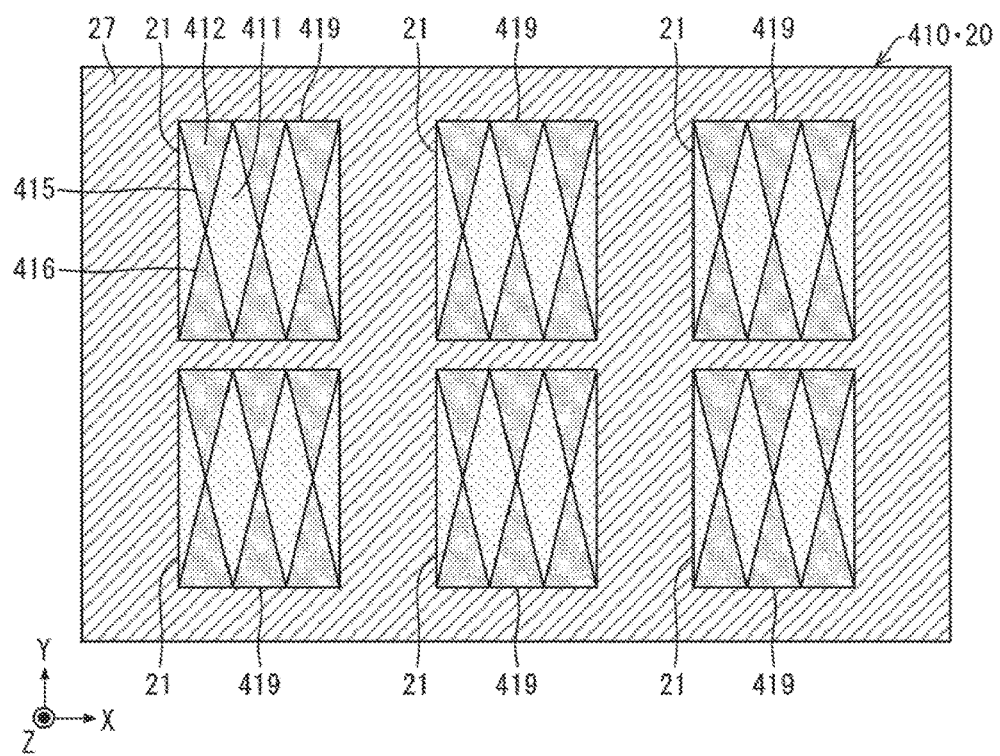

FIG. 11 is a plan view of a vapor deposition mask and a magnet plate which are included in a vapor deposition device in accordance with Embodiment 4 of the present invention and overlap each other.

Figure 12:
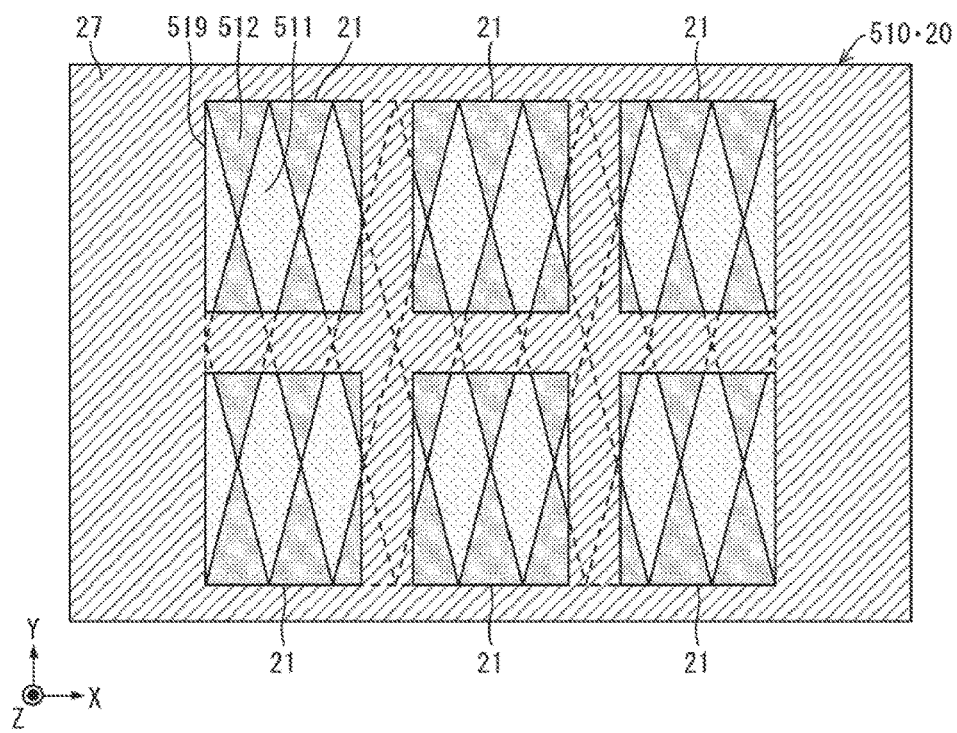

FIG. 12 is a plan view of the vapor deposition mask of the vapor deposition device in accordance with Embodiment 4 of the present invention and another arrangement example of the magnet plate of the vapor deposition device in accordance with Embodiment 4 of the present invention, the vapor deposition mask and the magnet plate overlapping each other.

Figure 13:
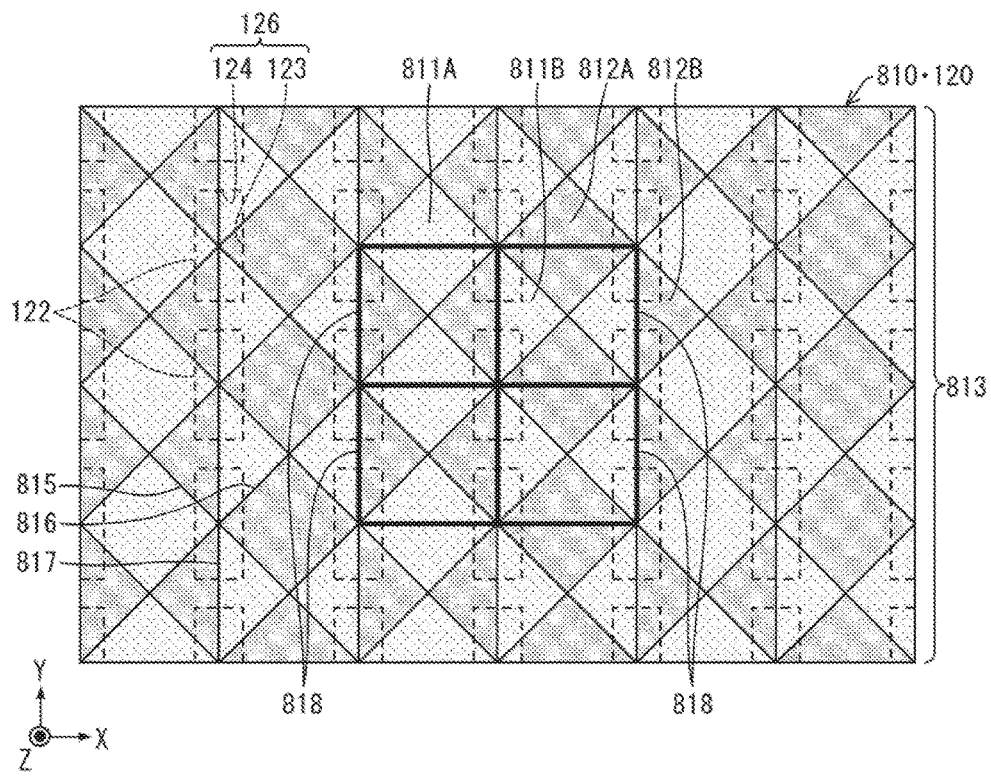

FIG. 13 is a plan view of a magnet plate and a vapor deposition mask which are included in a vapor deposition device in accordance with Embodiment 5 of the present invention and are seen from the vapor deposition mask side while being provided so as to face each other.

Figure 14:
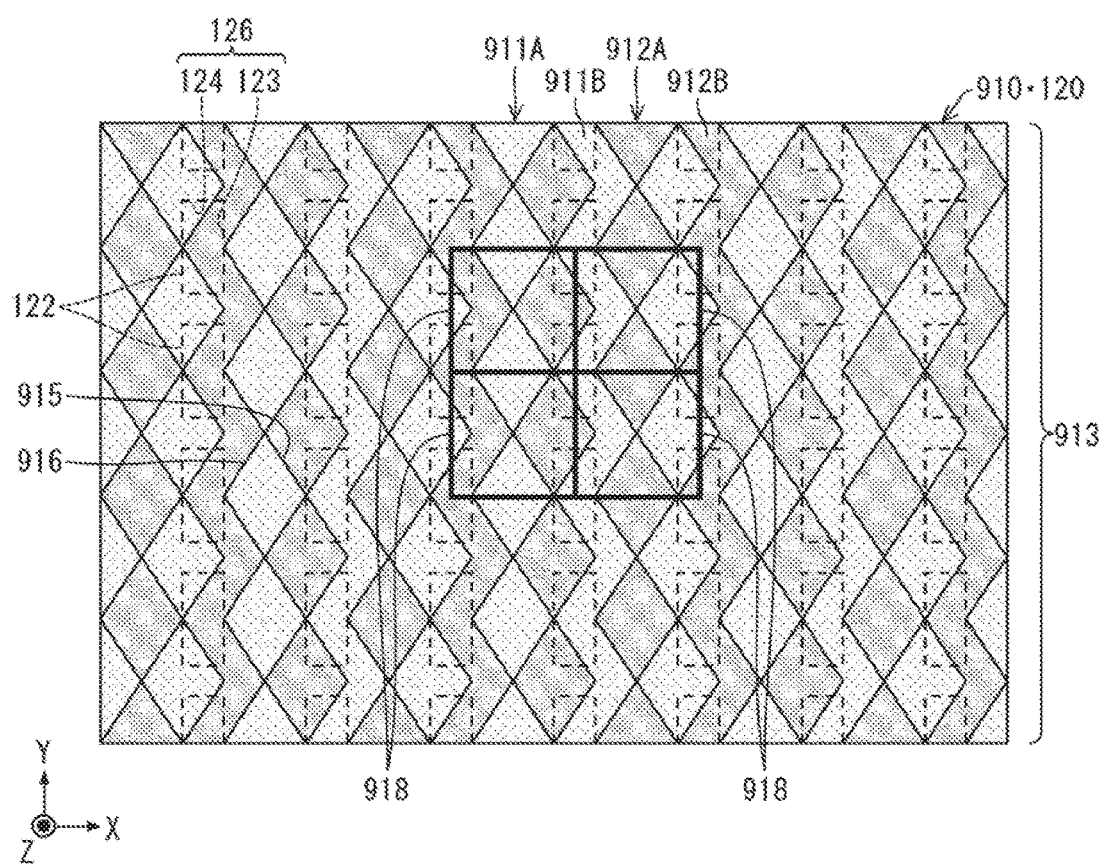

FIG. 14 is a plan view of a magnet plate and a vapor deposition mask which are included in a vapor deposition device in accordance with another example of Embodiment 5 of the present invention and are seen from the vapor deposition mask side while being provided so as to face each other.

Figure 15:
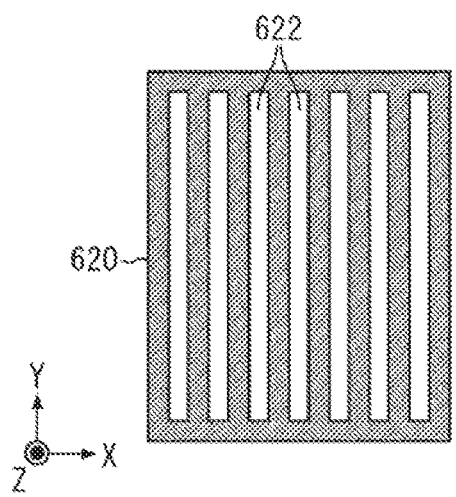
Figure 15:
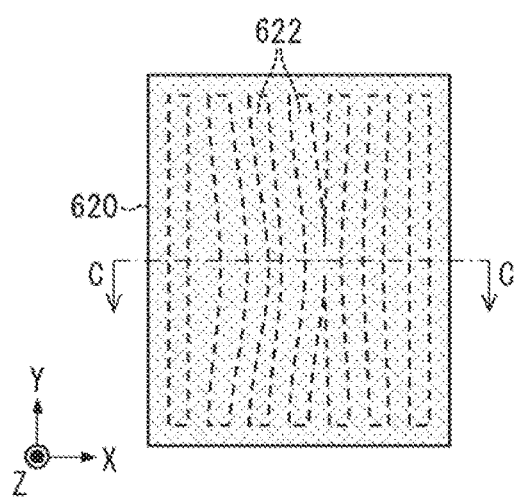
Figure 15:
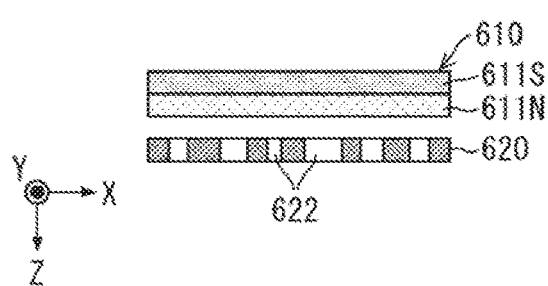

(a) of FIG. 15 is a plan view of a vapor deposition mask that is used in a conventional vapor deposition device. (b) of FIG. 15 is a plan view of a magnet and a vapor deposition mask that are seen from the vapor deposition mask side while being provided so as to face each other. (c) of FIG. 15 is a cross-sectional view taken along the line C-C of (b) of FIG. 15.

DESCRIPTION OF EMBODIMENTS

Embodiment 1

An embodiment of the present invention is described below with reference to (a) through (d) of FIG. 1 and FIG. 7.

<Vapor Deposition Device 1>

Figure 2:
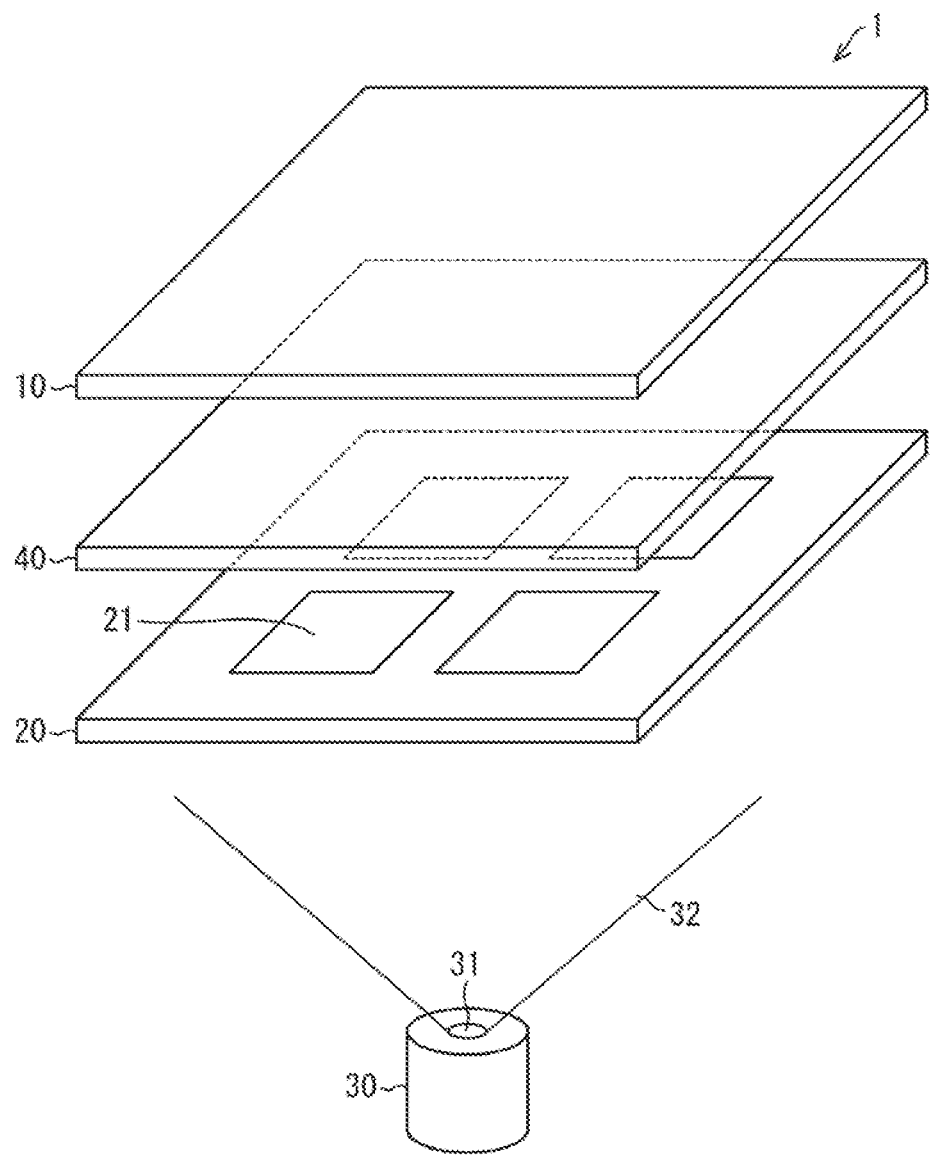

FIG. 2 is a perspective view illustrating an arrangement of a main part of a vapor deposition device in accordance with Embodiment 1.

A vapor deposition device 1 is a device for forming, in a film formation area (substrate film formation area) of a film formation target substrate 40, a vapor-deposited film made of a vapor deposition material 32. The vapor deposition device 1 can be used as a device for producing an EL display device, e.g., an organic EL display device or an inorganic EL display device, including a vapor-deposited film serving as a luminescent layer.

The vapor deposition device 1 mainly includes a film formation chamber (not illustrated), a magnet plate 10 (magnetic force generating source) provided in the film formation chamber, a vapor deposition mask 20, and a vapor deposition source 30.

Note that in order to keep an inside of the film formation chamber under vacuum during vapor deposition, the film formation chamber is provided with a vacuum pump (not illustrated) for evacuating the film formation chamber via an exhaust port (not illustrated) provided in the film formation chamber.

As illustrated in FIG. 2, a vapor-deposited film is formed on the film formation target substrate 40 in a state in which the vapor deposition mask 20 is provided on a front surface (the film formation area side surface) of the film formation target substrate 40 and the magnet plate 10 is provided on a rear surface of the film formation target substrate 40 so as to face the vapor deposition mask 20 via the film formation target substrate 40.

According to a vapor deposition process (vapor deposition method) for forming a film of a given pattern on the film formation target substrate 40 by use of the vapor deposition device 1, the vapor deposition mask 20 is adsorbed onto the film formation target substrate 40 by a magnetic force of the magnet plate 10 (this step is referred to as a "vapor deposition mask adsorbing step"), and the vapor deposition material 32 is adhered to the film formation target substrate 40 via an opening of the vapor deposition mask 20 (this step is referred to as a "vapor deposition material adhering step").

Note that on the magnet plate 10, a yoke member can be provided. With the arrangement, magnetic flux can be concentrated on the vapor deposition mask 20 on the lower surface side of the magnet plate 10 by closing a magnetic field generated on the upper surface side of the magnet plate 10. This makes it possible to increase an adsorbability of the vapor deposition mask 20 which adsorbability depends on the magnet plate 10. As a result, the vapor deposition mask 20 and the film formation target substrate 40 can be in closer contact with each other, and a vapor-deposited film can have higher pattern accuracy. As the yoke member, a yoke member that is high in electromagnetic characteristic such as a magnetic permeability and a remanence property is preferably used, and, for example, an iron material that is easily available at low cost (SS400) is particularly preferably used.

<Vapor Deposition Source 30>

The vapor deposition source 30 is provided on an opposite side from the film formation target substrate 40 so as to face the vapor deposition mask 20. The vapor deposition source 30 is, for example, a container in which to contain the vapor deposition material 32. Note that the vapor deposition source 30 can be a container in which to directly contain the vapor deposition material 3, or can be arranged to have a load lock pipe through which to supply the vapor deposition material 32 to the vapor deposition source 30.

The vapor deposition source 30 has, on its upper surface (i.e., surface which faces the vapor deposition mask 20), an emission hole 31 for emitting the vapor deposition material 32 in a form of vapor deposition particles.

The vapor deposition source 30 generates gaseous vapor deposition particles by heating the vapor deposition material 32 so that the vapor deposition material 32 is evaporated (in a case where the vapor deposition material 32 is a liquid material) or sublimated (in a case where the vapor deposition material 32 is a solid material). The vapor deposition source 30 emits, from the emission hole 31 toward the vapor deposition mask 20, the vapor deposition material 32 in a form of vapor deposition particles.

FIG. 2 illustrates one vapor deposition source 30. Note, however, that the vapor deposition device 1 in accordance with Embodiment 1 can include two or more vapor deposition sources 30.

For example, in a case where a luminescent layer containing a host material and a dopant material is formed as a vapor-deposited film, the vapor deposition device 1 can include a vapor deposition source for vapor-depositing the host material and a vapor deposition source for vapor-depositing the dopant material. Meanwhile, in a case where a luminescent layer containing a host material, a dopant material, and an assist material is formed as a vapor-deposited film, the vapor deposition device 1 can include a vapor deposition source for vapor-depositing the host material, a vapor deposition source for vapor-depositing the dopant material, and a vapor deposition source for vapor-depositing the assist material.

FIG. 2 shows an example in which one emission hole 31 is provided for the vapor deposition source 30, which is cylindrical. Note, however, that neither the vapor deposition source 30 nor the emission hole 31 is particularly limited in shape and number. The vapor deposition source 30 can be, for example, rectangular. One vapor deposition source 30 only needs to be provided with at least one emission hole 31 and can be provided with a plurality of emission holes 31. In a case where a plurality of emission holes 31 is provided, the plurality of emission holes 31 can be provided at regular intervals in a manner such as one-dimensionally (i.e., linearly) or two-dimensionally (e.g., planarly (in a tiled manner)).

<Vapor Deposition Mask 20>

The vapor deposition mask 20 is a mask for forming, on the film formation target substrate 40, a vapor-deposited film made of the vapor deposition material 32.

As illustrated in FIG. 2, the vapor deposition mask 20 has a plurality of mask opening areas 21 that faces a film formation area of the film formation target substrate 40 in a case where the vapor deposition mask 20 is provided so as to face the film formation target substrate 40. Each of the plurality of mask opening areas 21 has therein through holes which are provided as rectangular openings 22 (see (b) of FIG. 1) in a matrix pattern and through which vapor deposition particles (the vapor deposition material 32) are to pass during vapor deposition.

In the example shown in FIG. 2, the vapor deposition mask 20 is provided with four mask opening areas 21. Note, however, that the mask opening area 21 is not limited its shape and number to this example.

The vapor deposition mask 20 contains magnetic metal. This allows a magnetic force of the magnet plate 10 to attract the vapor deposition mask 20, so that the vapor deposition mask 20 can be made in close contact with the film formation target substrate 40. Examples of a metal to be used as a material of the vapor deposition mask 20 include iron, nickel, invar (an alloy of iron and nickel), and SUS430. Of these metals, invar, which is an alloy of iron and nickel, is suitably usable. This is because invar is less likely to be deformed by heat.

Note that at least a part of the vapor deposition mask 20 only needs to contain magnetic metal and the vapor deposition mask 20 can be a mask that has a stacked structure of a resin layer (e.g., a resinous mask) and a metallic layer (e.g., a metallic mask). In this case, examples of a resin that is used as a material of the resin layer of the vapor deposition mask 20 include polyimide, polyethylene, polyethylene naphthalate, polyethylene terephthalate, and epoxy resin. These resins can be used alone or in combinations of two or more kinds. In a case where the vapor deposition mask 20 is made of any one of these resins, the openings 22 can be formed with high accuracy by, for example, laser processing. This allows the openings 22 of the main body of the mask to have higher accuracy, and consequently allows a vapor-deposited film to be formed to have higher pattern accuracy.

<Magnet Plate 10>

Figure 1:
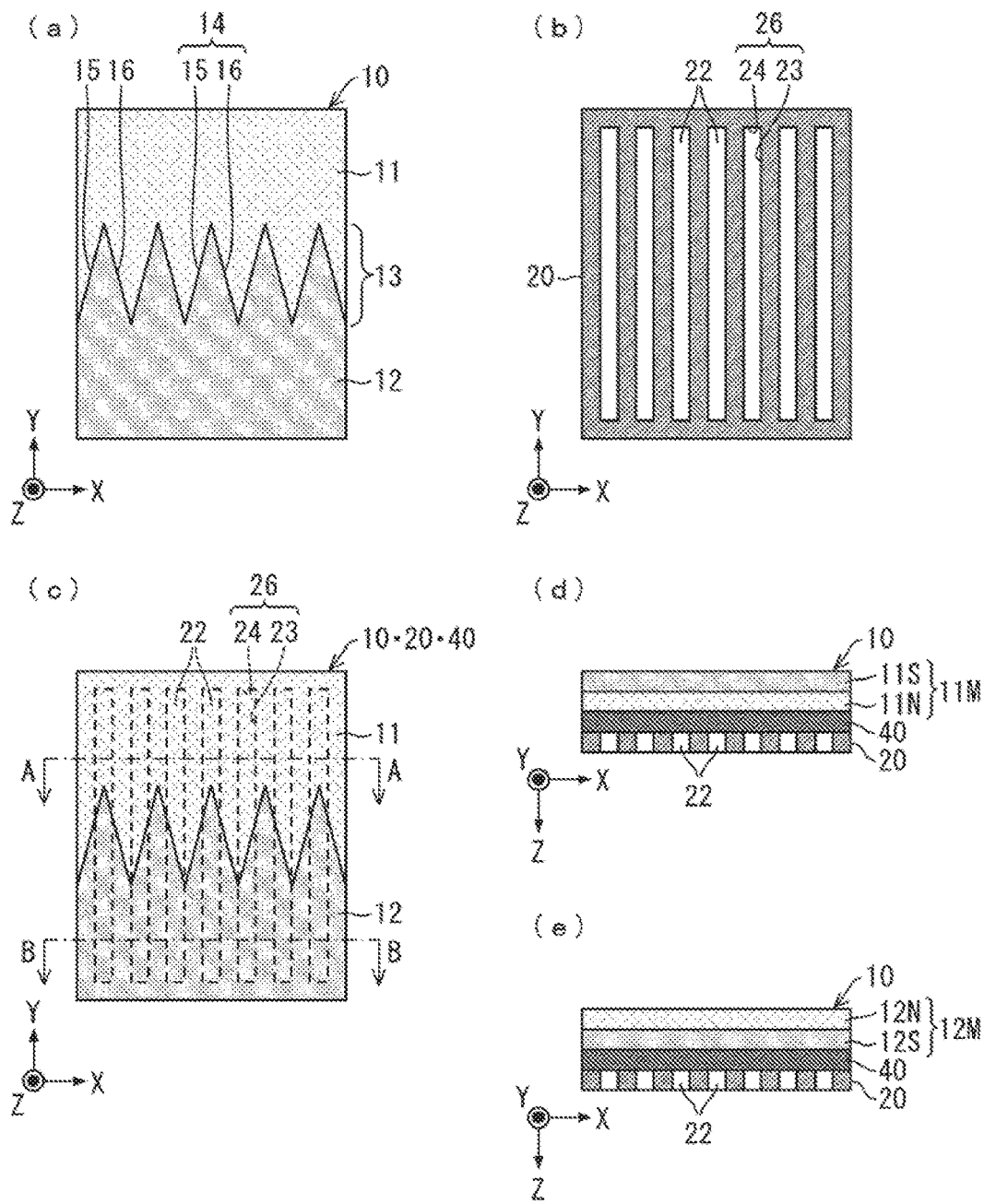

(a) of FIG. 1 is a plan view of a surface of a magnet plate of a vapor deposition device in accordance with Embodiment 1 of the present invention which surface faces a vapor deposition mask. (b) of FIG. 1 is a plan view of the vapor deposition mask. (c) of FIG. 1 is a plan view of the magnet plate and the vapor deposition mask which are seen from the vapor deposition mask side while being provided so as to face each other. (d) of FIG. 1 is a cross-sectional view taken along the line A-A of (c) of FIG. 1. (e) of FIG. 1 is a cross-sectional view taken along the line B-B of (c) of FIG. 1.

The magnet plate 10 has a plurality of magnetic domains in plan view, and adjacent magnetic domains of the plurality of magnetic domains differ in magnetic property.

More specifically, as illustrated in (a) of FIG. 1, the magnet plate 10 has a first magnetic domain 11 and a second magnetic domain 12 in plan view. Assume, for example, that in a surface of the magnet plate 10 which surface faces the film formation target substrate 40, the first magnetic domain 11 has a magnetic property which is an N pole, and the second magnetic domain 12 has a magnetic property which is an S pole. In this case, the magnetic property is reversed from the N pole to the S pole from the first magnetic domain 11 to the second magnetic domain 12, and the magnetic property is reversed from the S pole to the N pole from the second magnetic domain 12 to the first magnetic domain 11.

As illustrated in (d) and (e) of FIG. 1, the vapor deposition mask 20 and the magnet plate 10 are provided so that the film formation target substrate 40 is provided therebetween.

For example, the magnet plate 10 stores a first magnet 11M and a second magnet 12M (see (d) and (e) of FIG. 1). The first magnetic domain 11 can be constituted by a surface that has one (e.g., an N pole) of magnetic poles of the first magnet 11M, and the second magnetic domain 12 can be constituted by a surface that has the other (e.g., an S pole) of the magnetic poles of the second magnet 12M.

Specifically, in a case where the vapor deposition mask 20 side when seen from the magnet plate 10 is assumed to be a lower side, the first magnet 11M has an N pole 11N which is located on the lower side and has an S pole 11S which is located on an upper side. The N pole 11N of the first magnet 11M constitutes the first magnetic domain 11 in plan view. Meanwhile, the second magnet 12M has an S pole 12S which is located on the lower side and has an N pole 12N which is located on the upper side. The S pole 12S of the second magnet 12M constitutes the second magnetic domain 12 in plan view.

As illustrated in (a) of FIG. 1, in plan view, the first magnetic domain 11 and the second magnetic domain 12 have unevenness in a boundary therebetween, a protrusion of the first magnetic domain 11 is fitted in a recess of the second magnetic domain 12, and a protrusion of the second magnetic domain 12 is fitted in a recess of the first magnetic domain 11. Specifically, in plan view, an edge of the first magnetic domain 11 and an edge of the second magnetic domain 12 mesh with each other. In a region in which the edge of the first magnetic domain 11 and the edge of the second magnetic domain 12 mesh with each other, a magnetically reversed region 13 in which magnetic reversal occurs is formed.

Further, magnetic domain boundary lines 14 (boundary lines) that constitute the boundary between the first magnetic domain 11 and the second magnetic domain 12 have a zigzag shape made up of first line segments 15 extending in a first direction and second line segments 16 extending in a second direction different from the first direction.

Figure 3:
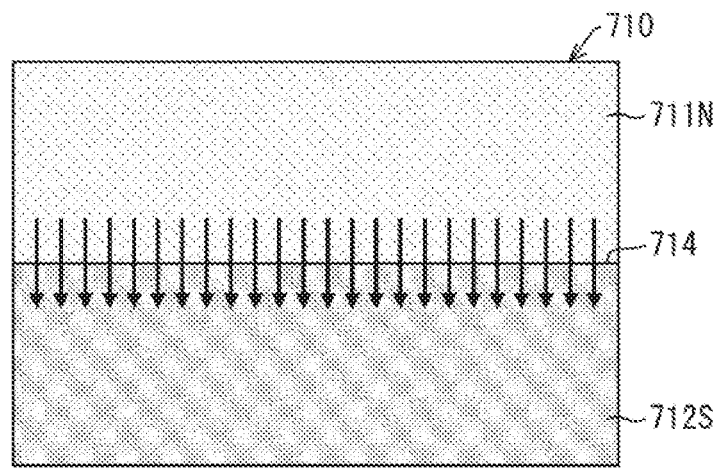
Figure 3:
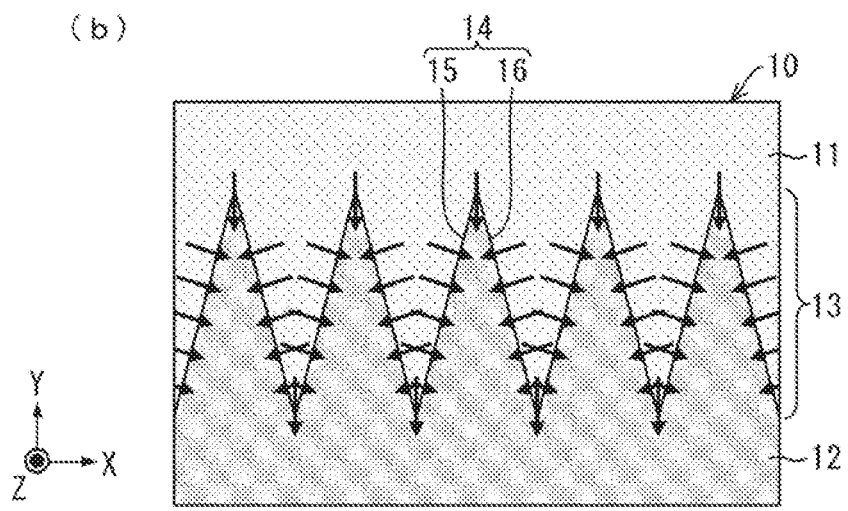

(a) of FIG. 3 is a plan view illustrating a direction in which a magnetic field is generated in a magnet plate of a conventional vapor deposition device. (b) of FIG. 3 is a plan view illustrating a direction in which a magnetic field is generated in the magnet plate of the vapor deposition device in accordance with Embodiment 1. In each of (a) and (b) of FIG. 3, an arrow indicates a direction in which a magnetic field is generated in a surface of a magnetized member 710 or the magnet plate 10.

As illustrated in (a) of FIG. 3, the magnetized member 710 of the conventional vapor deposition device has a magnetic domain boundary line 714, which is a straight line. Thus, a magnetic field is generated in the surface of the magnetized member 710 only in one direction in plan view. Thus, a magnetic field is generated in a single direction on and around the magnetic domain boundary line 714. This applies a heavy load to a vapor deposition mask, so that mask damage is caused.

In contrast, as illustrated in (b) of FIG. 3, the magnetic domain boundary lines 14 of the magnet plate 10 of Embodiment 1 are each arranged to include a first line segment 15 and a second line segment 16, which extend in respective different directions. In other words, the magnetic domain boundary lines 14 are each bent.

Thus, the magnet plate 10 has three directions of magnetic reversal (directions in each of which a magnetic property is reversed): (i) a direction orthogonal to the first direction; (ii) a direction orthogonal to the second direction; and (iii) a direction that equally divides an angle formed between the first direction and the second direction. As described above, in plan view, the magnet plate 10 has, on its surface, magnetic fields that are generated in respective three different directions. As a result, a region of the vapor deposition mask 20 to which region a load is applied can be distributed over lines that extend in respective three different directions. This allows a lighter load to be applied to the vapor deposition mask 20, so that the vapor deposition mask 20 can be less damaged.

The magnet plate 10 of Embodiment 1 has the magnetic domain boundary lines 14, which have a zigzag shape. Thus, magnetic reversal gently occurs in the magnetically reversed region 13, which is broadened in a Y direction. This allows a lighter load to be applied to the vapor deposition mask 20, so that the vapor deposition mask 20 can be less damaged.

Further, the magnetic domain boundary lines 14 between the magnetic domains which are adjacent to each other are acutely bent so as to form an acute angle therebetween. This causes magnetic fields generated in respective at least any two of three directions in which respective magnetic fields are generated (an angle formed between respective vectors of magnetic fields, generated in respective two directions, when starting points of the vectors are joined together) to form therebetween an obtuse angle. With the arrangement, the magnetically reversed region 13 can be made larger, and the region of the vapor deposition mask 20 to which region a load is applied can be distributed over a wider area. This allows a lighter load to be applied to the vapor deposition mask 20, so that the vapor deposition mask 20 can be less damaged.

(Magnetic Domain Boundary Lines 14 and Openings 22)

The vapor deposition mask 20 has the openings 22, which are rectangular. In the example of (b) of FIG. 1, the vapor deposition mask 20 has one mask opening area 21 and has, in the mask opening area 21, the openings 22, which are slit.

As illustrated in (c) of FIG. 1, assuming that a direction parallel to a direction in which a short side 24 of each of the openings 22 extends is an X direction and a direction parallel to a direction in which a long side 23 of each of the openings 22 extends is a Y direction, the magnet plate 10 has at least one magnetically reversed region 13 that extends in the Y direction. Further, the first line segment 15 and the second line segment 16, which constitute each of the magnetic domain boundary lines 14 between the first magnetic domain 11 and the second magnetic domain 12, which are adjacent to each other, are each inclined to an opening side 26 (the long side 23 and the short side 24) of an opening 22.

The arrangement allows a repulsive force and an attractive force that are exerted on a region of the vapor deposition mask 20 which region is located between adjacent openings 22 to be offset. Thus, mask strain can be prevented.

Note that since a part of the vapor deposition mask 20 which part faces a region of the magnet plate 10 which region is different from the magnetically reversed region 13 is polarized so as to be magnetized to a single magnetic pole, the part of the vapor deposition mask 20 may suffer from mask strain. Thus, in the surface of the magnet plate 10, in plan view, the magnetically reversed region 13 preferably has a larger area, and a region of the magnet plate 10 in which region no magnetic reversal occurs preferably has a smaller area. For example, the magnetically reversed region 13 preferably has an area that is not less than half an area of the surface of the magnet plate 10 which surface faces the film formation target substrate.

With the arrangement of the region of the vapor deposition mask 20 which region is located between the adjacent openings 22 and on which region the repulsive force and the attractive force are exerted, a region in which the repulsive force and the attractive force are offset can have a larger area. This makes it possible to more reliably prevent mask strain.

<Variation 1 in Accordance with Shape of Magnetic Domain of Magnet Plate>

The above description takes, as an example of the magnet plate of the vapor deposition device 1, the magnet plate 10 which has the magnetic domain boundary lines having a zigzag shape. Note, however, that the magnet plate of Embodiment 1 can have an arrangement that is not limited to the above arrangement of the magnet plate 10.

Figure 4:
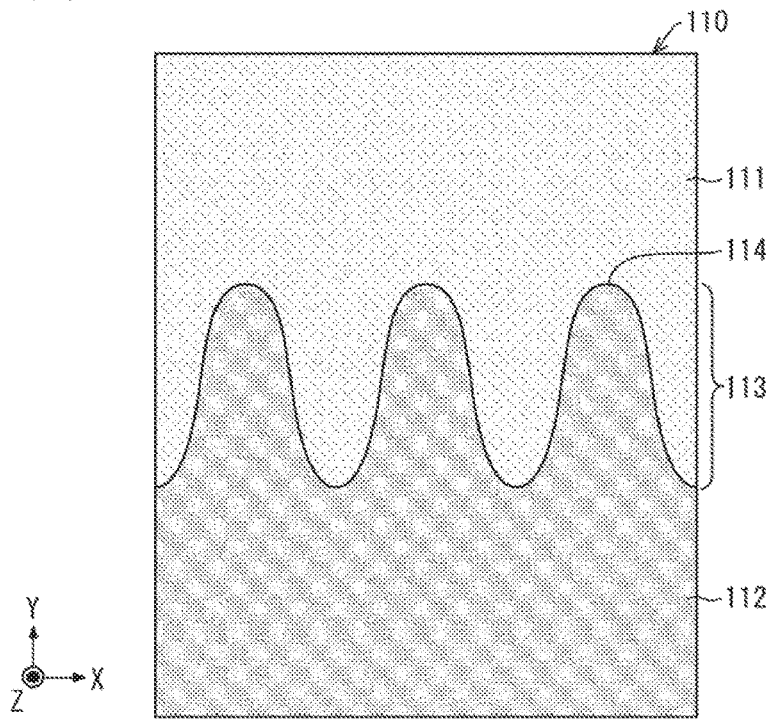
Figure 4:
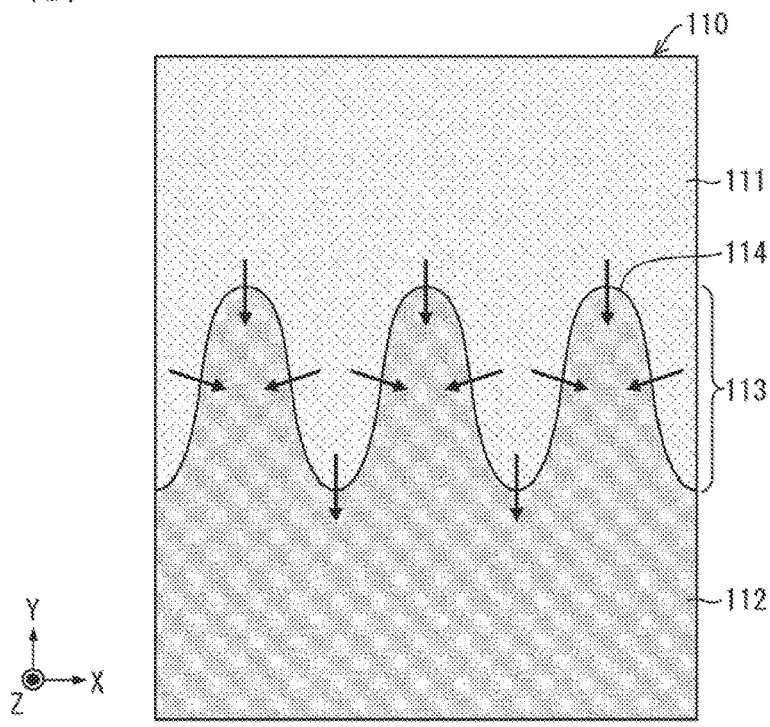

(a) of FIG. 4 is a plan view showing another arrangement example of the magnet plate. (b) of FIG. 4 is a plan view illustrating a direction in which a magnetic field is generated in the magnet plate of the another arrangement example. In (b) of FIG. 4, an arrow indicates a direction in which a magnetic field is generated.

As the magnet plate of the vapor deposition device 1, it is also possible to use a magnet plate 110 illustrated in (a) of FIG. 4.

As illustrated in (a) of FIG. 4, the magnet plate 110 in accordance with a variation has a first magnetic domain 111 and a second magnetic domain 112. The magnet plate 110 has magnetic domain boundary lines 114 which have a curve zigzag shape (sine wave shape).

Thus, the magnetic domain boundary lines 114 of the magnet plate 110 are each inclined to the opening side 26 of the opening 22. The magnet plate 110 which has the magnetic domain boundary lines 114 having the curve zigzag shape causes gentler magnetic reversal in the Y direction than the magnet plate which has the magnetic domain boundary lines having the zigzag shape.

Further, as illustrated in (b) of FIG. 4, the magnet plate 110, which has the magnetic domain boundary lines 114 having the curve zigzag shape, has more different directions of magnetic reversal which different directions continuously change, as compared with the magnet plate which has the magnetic domain boundary lines having the zigzag shape. In plan view, the magnet plate 110 has magnetic fields that are generated in respective many directions, i.e., three or more different directions.

The arrangement allows a lighter load to be applied to the vapor deposition mask 20, so that the vapor deposition mask 20 can be less damaged.

Further, the magnetic domain boundary lines 114 of the magnetic domains which are adjacent to each other are acutely curved. This causes magnetic fields generated in respective at least any two of many directions in which respective magnetic fields are generated to form therebetween an obtuse angle. With the arrangement, the magnetically reversed region 113 can be made larger, and the region of the vapor deposition mask 20 to which region a load is applied can be distributed over a wider area. This allows a lighter load to be applied to the vapor deposition mask 20, so that the vapor deposition mask 20 can be less damaged.

<Variation 2 in Accordance with Opening of Vapor Deposition Mask>

The above description takes, as an example of the vapor deposition mask of the vapor deposition device 1, the vapor deposition mask 20 which has the slit openings. Note, however, that the vapor deposition mask of Embodiment 1 can have an arrangement that is not limited to the above arrangement of the vapor deposition mask 20.

Figure 5:
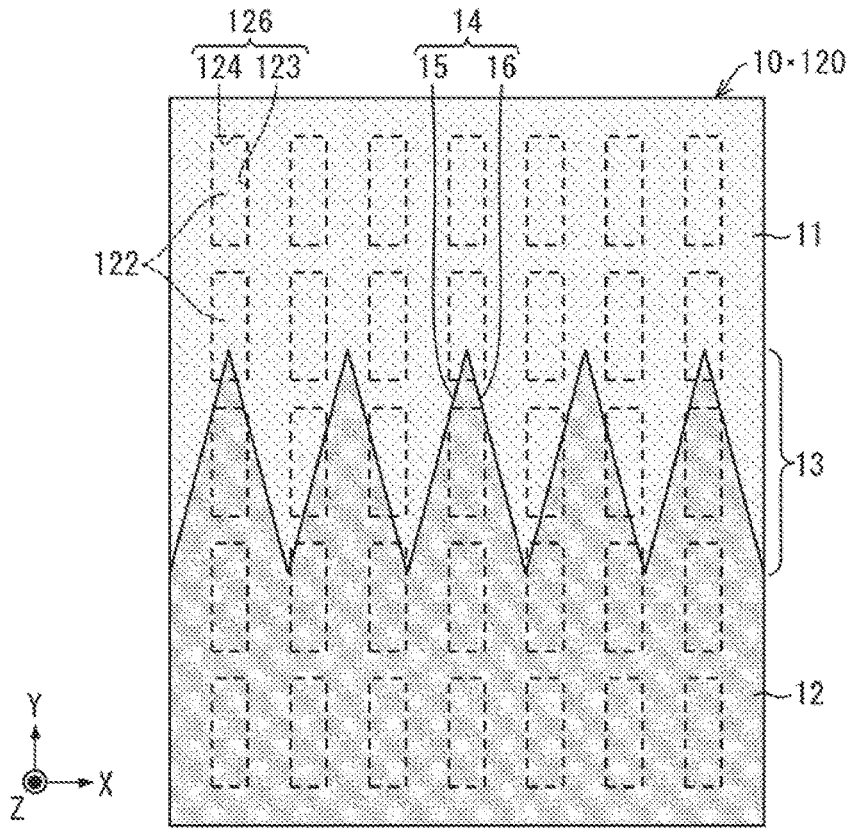
FIG. 5 is a plan view of a vapor deposition mask and a magnet plate each in accordance with still another arrangement example of Embodiment 1 and shows a positional relationship between (a) openings of the vapor deposition mask and (b) magnetic domain boundary lines of the magnet plate.

FIG. 5 is a plan view of a vapor deposition mask and a magnet plate each in accordance with still another arrangement example of Embodiment 1 and shows a positional relationship between (a) openings of the vapor deposition mask and (b) magnetic domain boundary lines of the magnet plate.

As the vapor deposition mask of the vapor deposition device 1, it is also possible to use a vapor deposition mask 120 which has slotted openings 122 (see FIG. 5).

In the magnetically reversed region 13 of the magnet plate 10, the magnetic domain boundary lines 14 are each inclined to an opening side 126 (a long side 123 and a short side 124) of each of the openings 122. Thus, even in a case where the vapor deposition mask 120 having the slotted openings 122 is used, in a part of the vapor deposition mask 120 which part faces the magnetically reversed region 13, regions of the vapor deposition mask 120 which regions face each other via an opening 122 are less likely to be magnetized to a single magnetic pole. This makes it possible to prevent occurrence of mask strain.

<Variation 3 in Accordance with Further Arrangement of Vapor Deposition Device 1>

Figure 6:
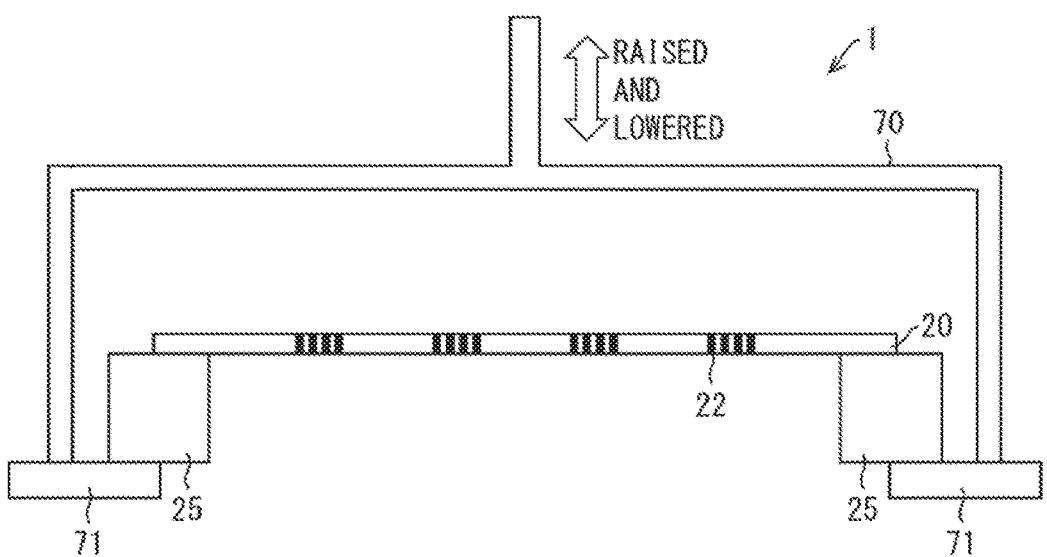
FIG. 6 is a side view showing a further arrangement example of the vapor deposition device in accordance with Embodiment 1 of the present invention.

FIG. 6 is a side view showing a further arrangement example of the vapor deposition device in accordance with Embodiment 1.

As illustrated in FIG. 6, the vapor deposition device 1 can include a mask frame 25 that supports an edge of the vapor deposition mask 20, a mask stand 71 on which the mask frame 25 can be placed, and a mask raising and lowering mechanism 70 that is capable of vertically raising and lowering the mask stand 71.

The mask frame 25, the mask stand 71, and the mask raising and lowering mechanism 70 constitute a holding member for vertically raising and lowering the vapor deposition mask 20 while holding the vapor deposition mask 20.

With the arrangement, by raising the vapor deposition mask 20 to the film formation target substrate 40 while causing the vapor deposition mask 20 and the film formation target substrate 40 to face each other, it is possible to assist the vapor deposition mask 20 and the film formation target substrate 40 to be in closer contact with each other.

Note that the mask raising and lowering mechanism 70 is not particularly limited provided that the mask raising and lowering mechanism 70 is capable of vertically moving the mask stand 71. For example, the mask raising and lowering mechanism 70 can be a mask raising and lowering mechanism that causes an actuator to raise and lower a mask holder including the mask stand 71, or can be a mask raising and lowering mechanism that causes lowering and lifting of a wire connected to the mask holder to raise and lower the mask holder.

<Variation 4 in Accordance with Further Arrangement of Vapor Deposition Device 1>

Figure 7:
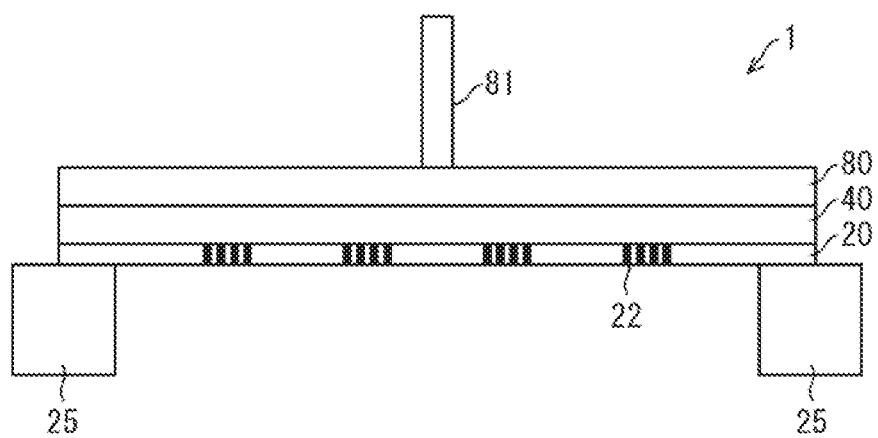
FIG. 7 is a side view showing a further arrangement example of the vapor deposition device in accordance with Embodiment 1 of the present invention.

FIG. 7 is a side view showing a further arrangement example of the vapor deposition device in accordance with Embodiment 1.

As illustrated in FIG. 7, the vapor deposition device 1 can include a presser board 80, which is a plate-like member provided on the film formation target substrate 40 which has been adsorbed onto the vapor deposition mask 20, and a presser raising and lowering mechanism 81 that is capable of applying a load to the film formation target substrate 40 from above by vertically raising and lowering the presser board 80.

The presser board 80 and the presser raising and lowering mechanism 81 constitute a presser member that allows the vapor deposition mask 20 and the film formation target substrate 40 to be in closer contact with each other and prevents the film formation target substrate 40 from being positionally displaced.

With the arrangement, the vapor deposition mask 20 and the film formation target substrate 40 can be prevented from being positionally displaced during the vapor deposition process.

Note that the presser raising and lowering mechanism 81 can be a presser raising and lowering mechanism that causes an actuator to raise and lower the presser board 80, or can be a presser raising and lowering mechanism that causes lowering and lifting of a wire connected to the presser board 80 to raise and lower the presser board 80.

Embodiment 2

Another embodiment of the present invention is described below with reference to (a) and (b) of FIG. 8. Note that for convenience, members having functions identical to those of the respective members described in Embodiment 1 are given respective identical reference numerals, and a description of those members is omitted here.

(a) of FIG. 8 is a plan view of a magnet plate of a vapor deposition device in accordance with Embodiment 2. (b) of FIG. 8 is a plan view of the magnet plate and a vapor deposition mask which are seen from the vapor deposition mask side while being provided so as to face each other. In (b) of FIG. 8, an arrow indicates a direction in which a magnetic field is generated in a surface of a magnet plate 210.

As illustrated in (a) of FIG. 8, the magnet plate 210 of a vapor deposition device 1 of Embodiment 2 is arranged as in the case of the magnet plate 10 of the vapor deposition device 1 in accordance with Embodiment 1 except that the magnet plate 210 has a plurality of magnetically reversed regions 13 in plan view.

As illustrated in (a) of FIG. 8, the magnet plate 210 has, in plan view, a plurality of first magnetic domains 11 and a plurality of second magnetic domains 12. The plurality of first magnetic domains 11 and the plurality of second magnetic domains 12 are arranged, in a direction (in the example of FIG. 8, the Y direction) parallel to a direction in which a side of an opening extends, so as to alternate with each other.

For example, the magnet plate 210 can store magnets 11M whose number matches the number of the respective magnetic domains and magnets 12M whose number matches the number of the respective magnetic domains, the plurality of first magnetic domains 11 each can be constituted by a surface that has one (e.g., an N pole) of magnetic poles of a corresponding magnet 11M, and the plurality of second magnetic domains 12 each can be constituted by a surface that has the other (e.g., an S pole) of the magnetic poles of a corresponding magnet 12M.

The magnet plate 210 of Embodiment 2 has a plurality of sets of magnetic domain boundary lines 14 which sets have a zigzag shape. Specifically, the plurality of sets of magnetic domain boundary lines 14 is present in the direction (in the example of FIG. 8, the Y direction) parallel to the direction in which a side of an opening extends, so that magnetic reversal occurs in the Y direction a plurality of times.

The arrangement allows a magnetically reversed region 13 to have a larger area in plan view, and makes it possible to more reliably prevent mask strain from occurring in a vapor deposition mask 120 due to magnetization of the vapor deposition mask 120 to a single magnetic pole.

Note that more times of occurrence of magnetic reversal in the Y direction cause further segmentation of a part of the vapor deposition mask 120 on which part a repulsive force and an attractive force are exerted, so that the repulsive force and the attractive force which are exerted on the vapor deposition mask 120 are averaged overall. This makes it possible to prevent local mask strain.

Further, as illustrated in (b) of FIG. 8, each of the plurality of sets of magnetic domain boundary lines 14 of the magnet plate 210 of Embodiment 2 is arranged to include a first line segment 15 and a second line segment 16, which extend in respective different directions. In other words, each of the plurality of sets of magnetic domain boundary lines 14 is bent.

Thus, the magnet plate 210 has three directions of magnetic reversal (directions in each of which a magnetic property is reversed): (i) a direction orthogonal to the first direction; (ii) a direction orthogonal to the second direction; and (iii) a direction that equally divides an angle formed between the first direction and the second direction. As described above, in plan view, the magnet plate 210 has, on its surface, magnetic fields that are generated in respective three different directions. As a result, a region of the vapor deposition mask 120 to which region a load is applied can be distributed over lines that extend in respective three different directions. This allows a lighter load to be applied to the vapor deposition mask 120, so that the vapor deposition mask 120 can be less damaged.

Embodiment 3

Still another embodiment of the present invention is described below with reference to (a) and (b) of FIG. 9, and FIG. 10. Note that for convenience, members having functions identical to those of the respective members described in Embodiments 1 and 2 are given respective identical reference numerals, and a description of those members is omitted here.

(a) of FIG. 9 is a plan view of a magnet plate of a vapor deposition device in accordance with Embodiment 3. (b) of FIG. 9 is a plan view of the magnet plate and a vapor deposition mask which are seen from the vapor deposition mask side while being provided so as to face each other.

As illustrated in (a) of FIG. 9, a magnet plate 310 of a vapor deposition device 1 of Embodiment 3 has a plurality of magnetic domains in plan view, and is arranged as in the case of the magnet plate 10 of the vapor deposition device 1 in accordance with Embodiment 1 except that the plurality of magnetic domains of the magnet plate 310 is arranged in a lattice pattern.

As the plurality of magnetic domains, the magnet plate 310 has first magnetic domains 311 and second magnetic domains 312. The first magnetic domains 311 and the second magnetic domains 312 differ in magnetic property. The first magnetic domains 311 and the second magnetic domains 312 are partitioned with first line segments 315 extending in the first direction and second line segments 316 extending in the second direction, which intersects the first direction. The first magnetic domains 311 and the second magnetic domains 312 are arranged so as to be adjacent to each other via the first line segments 315 or the second line segments 316. Specifically, in the magnet plate 310, the first line segments 315 and the second line segments 316 are arranged in a net-like pattern, and the first line segments 315 and the second line segments 316 constitute bent magnetic domain boundary lines.

For example, the magnet plate 310 stores a plurality of magnets 11M and 12M which is diamond-shaped or triangular and is provided in a lattice pattern. The plurality of magnets 11M and 12M can be arranged such that in plan view, a magnet 11M and a magnet 12M which are adjacent to each other via a side differ in magnetic property. This makes it possible to form the magnetic domains which are arranged in a lattice pattern while including the first magnetic domains 311 which are diamond-shaped and the second magnetic domains 312 which are diamond-shaped.

In the example shown in (a) of FIG. 9, in order to make the entirety of the magnet plate 310 quadrangular, the magnet plate 310 stores, at its edges, magnets 11M and 12M which are triangular. Note, however, that the magnets 11M and 12M do not necessarily need to be triangular in a case where the entirety of the magnet plate 310 does not need to be made quadrangular.

As illustrated in (a) of FIG. 9, the entirety of a surface of the magnet plate 310 which surface faces a vapor deposition mask 120 (i.e., in plan view, the entire surface of the magnet plate) is a magnetically reversed region 313. This causes the entirety of the vapor deposition mask 120 to face the magnetically reversed region 313, so that mask strain can be more reliably prevented.

As illustrated in (b) of FIG. 9, assuming that a direction parallel to a direction in which a short side 124 of each of openings 122 extends is an X direction and a direction parallel to a direction in which a long side 123 of each of the openings 122 extends is a Y direction, the magnet plate 310 is magnetically reversed a plurality of times in each of the Y direction and the X direction.

The arrangement allows a repulsive force and an attractive force that are exerted on a region of the vapor deposition mask 120 which region is located between adjacent openings 122 to be offset. Thus, mask strain can be prevented. Note that more times of occurrence of magnetic reversal in each of the Y direction and the X direction cause further segmentation of a part of the vapor deposition mask 120 on which part a repulsive force and an attractive force are exerted, so that the repulsive force and the attractive force which are exerted on the vapor deposition mask 120 are averaged overall. This makes it possible to prevent local mask strain.

As illustrated in (b) of FIG. 9, a first line segment 315 and a second line segment 316, each of which serves as a magnetic domain boundary line, are each inclined to an opening side 126 of an opening 122. With the arrangement, magnetic reversal gently occurs in each of the X direction and the Y direction in plan view. This allows a lighter load to be applied to the vapor deposition mask 20, so that the vapor deposition mask 120 can be less damaged.

FIG. 10 is a plan view illustrating a direction in which a magnetic field is generated in the magnet plate of the vapor deposition device in accordance with Embodiment 3. In FIG. 10, an arrow indicates a direction in which a magnetic field is generated.

As illustrated in FIG. 10, in the magnet plate 310 of Embodiment 3, the first line segments 315 and the second line segments 316 are arranged in a net-like pattern as the magnetic domain boundary lines. Thus, as compared with the magnet plate 10 in accordance with Embodiment 1 (see (b) of FIG. 3), the magnet plate 310 of Embodiment 3 has (i) more directions of magnetic reversal and (ii) more magnetic fields that are generated in respective different directions in plan view.

Thus, a region of the vapor deposition mask 120 to which region a load is applied can be distributed over lines that extend in respective many different directions. This allows a lighter load to be applied to the vapor deposition mask 120, so that the vapor deposition mask 120 can be less damaged.

Further, as illustrated in FIG. 10, the first line segment 315 and the second line segment 316 intersect each other so as to form an acute angle therebetween. This causes magnetic fields generated in respective at least any two of many directions in which respective magnetic fields are generated to form therebetween an obtuse angle. With the arrangement, a region of the vapor deposition mask 120 to which region a load is applied can be distributed over a wider area. This allows a lighter load to be applied to the vapor deposition mask 120, so that the vapor deposition mask 120 can be less damaged.

Embodiment 4

A further embodiment of the present invention is described below with reference to FIGS. 11 and 12. Note that for convenience, members having functions identical to those of the respective members described in Embodiments 1 through 3 are given respective identical reference numerals, and a description of those members is omitted here.

FIG. 11 is a plan view of a magnet plate of a vapor deposition device in accordance with Embodiment 4.

As illustrated in FIG. 11, a magnet plate 410 of a vapor deposition device 1 of Embodiment 4 is arranged as in the case of the magnet plate 10 of the vapor deposition device 1 in accordance with Embodiment 1 except that the magnet plate 410 has a plurality of magnetic force generated regions 419 in plan view.

A vapor deposition mask 20 has (i) mask opening areas 21 (opening regions) in each of which openings are provided at a given density and (ii) a non-opening region 27 in which no opening is provided.

The magnet plate 410 has the plurality of magnetic force generated regions 419 in plan view only in its region which faces the mask opening areas 21 of the vapor deposition mask 20, and has no magnetic force generated region 419 in its region which faces the non-opening region 27 of the vapor deposition mask 20.

Each of the plurality of magnetic force generated regions 419 of the magnet plate 410 has a plurality of magnetic domains in plan view, and the plurality of magnetic domains is arranged in a lattice pattern.

As the plurality of magnetic domains, each of the plurality of magnetic force generated regions 419 has first magnetic domains 411 and second magnetic domains 412. The first magnetic domains 411 and the second magnetic domains 412 differ in magnetic property. The first magnetic domains 411 and the second magnetic domains 412 are partitioned with first line segments 415 extending in the first direction and second line segments 416 extending in the second direction, which intersects the first direction. The first magnetic domains 411 and the second magnetic domains 412 are arranged so as to be adjacent to each other via the first line segments 415 or the second line segments 416. Specifically, in each of the plurality of magnetic force generated regions 419 of the magnet plate 410, the first line segments 415 and the second line segments 416 are arranged in a net-like pattern, and a first line segment 415 and a second line segment 416 each serve as a magnetic domain boundary line.

As illustrated in FIG. 11, the entirety of a surface of each of the plurality of magnetic force generated regions 419 of the magnet plate 410 which surface faces the vapor deposition mask 20 is a magnetically reversed region 413. This causes the entirety of the vapor deposition mask 20 to face the magnetically reversed region 413, so that mask strain can be more reliably prevented.

Assuming that, a direction parallel to a direction in which a short side of each of openings (not illustrated) extends is an X direction and a direction parallel to a direction in which a long side of each of the openings extends is a Y direction, each of the plurality of magnetic force generated regions 419 of the magnet plate 410 is magnetically reversed a plurality of times in the Y direction. This allows a repulsive force and an attractive force that are exerted on a region of the vapor deposition mask 20 which region is located between adjacent openings to be offset. Thus, mask strain can be prevented.

As illustrated in FIG. 11, the first line segment 415 and the second line segment 416, each of which serves as a magnetic domain boundary line, are each inclined to an opening side of each of the mask opening areas 21. With the arrangement, magnetic reversal gently occurs in each of the X direction and the Y direction in plan view. This allows a lighter load to be applied to the mask opening areas 21 of the vapor deposition mask 20, so that the vapor deposition mask 20 can be less damaged.

Assume that a magnetic force generating source is provided for the entirety of a surface of the magnet plate which surface faces the vapor deposition mask. In this case, the vapor deposition mask 20 and a film formation target substrate 40 are brought into too close contact with each other. Thus, during separation of the vapor deposition mask 20 and the film formation target substrate 40 from each other after film formation, it is impossible to easily separate the vapor deposition mask 20 from the film formation target substrate 40. As a result, the film formation target substrate 40 and the vapor deposition mask 20 may be damaged.

In contrast, the magnet plate 410 of Embodiment 4 has no magnetic domain in its partial region in plan view. More specifically, in plan view, the magnet plate 410 of Embodiment 4 has no magnetic force generated region 419 in its region which faces no mask opening area 21 of the vapor deposition mask 20.

The arrangement (i) allows the vapor deposition mask 20 and the film formation target substrate 40 to be in close contact with each other in the mask opening areas 21 of the vapor deposition mask 20 and (ii) allows the film formation target substrate 40 and the vapor deposition mask 20 to be easily and smoothly separated from each other after film formation.

Note that the film formation target substrate 40 and the vapor deposition mask 20 only need to be in close contact with each other only in the mask opening areas 21 of the vapor deposition mask 20. Thus, even the magnet plate 410 which has no magnetic force generated region 419 in its region which faces no mask opening area 21 of the vapor deposition mask 20 causes no deterioration in vapor deposition pattern accuracy.

The above description discusses an arrangement in which the magnet plate 410 has the plurality of magnetic force generated regions 419 only in its region which faces the mask opening areas 21, and has no magnetic force generated region 419 in its region which faces the non-opening region 27 of the vapor deposition mask 20. Note, however, that the magnet plate 410 of Embodiment 4 can have an arrangement that is not limited to the above arrangement. Specifically, the magnet plate 410 can also be arranged to (i) have a magnetic force generated region 519 in the entirety of its surface which faces the vapor deposition mask 20 and (ii) store, in its region which faces no mask opening area 21, a member for reducing a magnetic force, such as a non-magnetic body.

<Variation>

The above description takes, as an example of the magnet plate of the vapor deposition device 1, the magnet plate 410 which has the plurality of magnetic force generated regions 419 in its region which faces the mask opening areas 21 of the vapor deposition mask 20, and has no magnetic force generated region 419 in its region which faces no mask opening area 21 of the vapor deposition mask 20. Note, however, that the magnet plate of Embodiment 4 can have an arrangement that is not limited to the above arrangement.

In a case where the magnet plate which is arranged to have the magnetic force generated regions only in its region which faces the mask opening areas 21 is insufficient for the vapor deposition mask 20 and the film formation target substrate 40 to be in close contact with each other, it is possible to provide a region of the magnet plate which region faces no mask opening area 21 with a magnetic force generated region in view of workability of an operation to separate the film formation target substrate 40 and the vapor deposition mask 20 from each other after film formation.

FIG. 12 is a plan view of the vapor deposition mask of the vapor deposition device in accordance with Embodiment 4 and another arrangement example of the magnet plate of the vapor deposition device in accordance with Embodiment 4, the vapor deposition mask and the magnet plate overlapping each other.

A magnet plate 510 has a single magnetic force generated region 519 that faces each of (i) the mask opening areas 21 of the vapor deposition mask 20 and (ii) regions between adjacent mask opening areas 21.

The magnet plate 510 which is thus arranged to have the magnetic force generated region 519 which faces the regions between the adjacent mask opening areas 21 also makes it possible to obtain an effect similar to that yielded by the magnet plate 410 of Embodiment 4.

Further, the magnet plate 510, which has the single magnetic force generated region 519, can have a simpler and easier arrangement than the magnet plate 410.

Embodiment 5

A further embodiment of the present invention is described below with reference to FIGS. 13 and 14. Note that for convenience, members having functions identical to those of the respective members described in Embodiments 1 through 4 are given respective identical reference numerals, and a description of those members is omitted here.

FIG. 13 is a plan view of a magnet plate and a vapor deposition mask which are included in a vapor deposition device in accordance with Embodiment 5 and are seen from the vapor deposition mask side while being provided so as to face each other.

As illustrated in FIG. 13, a magnet plate 810 of a vapor deposition device 1 of Embodiment 5 has a plurality of magnetic domains in plan view, and is arranged as in the case of the magnet plate 10 of the vapor deposition device 1 in accordance with Embodiment 1 except that (i) the plurality of magnetic domains is arranged in a lattice pattern while regularly changing in shape in correspondence with an arrangement of openings 122 and (ii) the magnet plate 810 has magnetic domain boundary lines 815, 816, and 817 that are present in each of the X direction and the Y direction and whose number changes in accordance with the number of the openings 122.

As the plurality of magnetic domains, the magnet plate 810 has first magnetic domains and second magnetic domains in plan view. The first magnetic domains and the second magnetic domains differ in magnetic property. The magnet plate 810 has, as the first magnetic domains, first magnetic domains 811A which are quadrangular and first magnetic domains 811B which are triangular. Meanwhile, the magnet plate 810 has, as the second magnetic domains, second magnetic domains 812A which are quadrangular and first magnetic domains 812B which are triangular.

As illustrated in FIG. 13, the first magnetic domains 811A and the second magnetic domains 812A are alternately arranged in the X direction in plan view while sharing their respective vertices.

Further, in plan view, the first magnetic domains 811A are arranged in the Y direction while sharing their respective vertices, whereas the second magnetic domains 812A are arranged in the Y direction while sharing their respective vertices.

In addition, the first magnetic domains 811B which are triangular and the first magnetic domains 812B which are triangular are arranged in regions between the first magnetic domains 811A and the second magnetic domains 812A so that adjacent magnetic domains differ in polarity.

With the arrangement, magnetic domain boundary lines extending in three directions are arranged. The magnetic domain boundary lines are magnetic domain boundary lines 815 and 816 which are boundary lines between (a) the first magnetic domains 811A or the second magnetic domains 812A and (b) the first magnetic domains 811B or the second magnetic domains 812B, and magnetic domain boundary lines 817 which are boundary lines between the first magnetic domains 811B and the second magnetic domains 812B.

Thus, the magnet plate 810 has magnetic fields that are generated in respective three different directions: (i) a direction orthogonal to the magnetic domain boundary lines 815; (ii) a direction orthogonal to the magnetic domain boundary lines 816; and a direction orthogonal to the magnetic domain boundary lines 817.

In a case where the magnet plate 810 and a vapor deposition mask 120 are superposed via a film formation target substrate 40, an intersection of three magnetic domain boundary lines, which are a magnetic domain boundary line 815, a magnetic domain boundary line 816, and a magnetic domain boundary line 817, overlaps an opening 122 in plan view. The intersection of the three magnetic domain boundary lines 815, 816, and 817 more preferably overlaps a midpoint of the opening 122.

As illustrated in FIG. 13, the entirety of a surface of the magnet plate 810 which surface faces the vapor deposition mask 120 (i.e., in plan view, the entire surface of the magnet plate) is a magnetically reversed region 813. This causes the entirety of the vapor deposition mask 120 to face the magnetically reversed region 813, so that mask strain can be more reliably prevented.

Assume here that as illustrated in FIG. 13, a region of the magnet plate 810 which region faces a region surrounded by (i) respective midpoints of two openings 122 which are adjacent to each other in the X direction and (ii) respective midpoints of two openings 122 which are adjacent, in the Y direction, to the respective two openings 122 which are adjacent to each other in the X direction is a unit region 818. In this case, a magnetic domain boundary line 815 and a magnetic domain boundary line 816 intersect each other in each unit region 818. Thus, in the each unit region 818, magnetic reversal occurs, across the boundary line 815 or the magnetic domain boundary line 816, at an intersection of (a) a line extending in each of the X direction and the Y direction, except a line passing through a center of the unit region 818, with (b) the magnetic domain boundary line 815 or the magnetic domain boundary line 816, so that magnetic reversal occurs two times.

Further, unit regions 818 which are adjacent to each other in the Y direction have identical magnetic domain arrangements, whereas unit regions 818 which are adjacent to each other in the X direction have magnetic domain arrangements in which magnetic properties are reversed.

Thus, the magnet plate 810 has the magnetic domain boundary lines which are pre sent in each of the X direction and the Y direction and whose number is equivalent to an integral multiple of the number of the openings 122. With the arrangement, according to the magnet plate 810, the number of times of occurrence of magnetic reversal in each of the X direction and the Y direction is equivalent to the integral multiple of the number of the openings 122.

The arrangement allows a repulsive force and an attractive force that are exerted on regions among all the openings 22 to be offset. Thus, (i) local mask strain occurring in units of openings 122 and (ii) mask damage can be prevented.

<Variation>

The magnet plate of the vapor deposition device 1 of Embodiment 5 can have an arrangement that is not limited to the arrangement of the magnet plate 810 illustrated in FIG. 13.

FIG. 14 is a plan view of a magnet plate and a vapor deposition mask which are included in a vapor deposition device in accordance with another example of Embodiment 5 and are seen from the vapor deposition mask side while being provided so as to face each other.

The magnet plate 910 has first magnetic domains and second magnetic domains. The first magnetic domains and the second magnetic domains differ in magnetic property. The magnet plate 910 has, as the first magnetic domains, first magnetic domains 911A which extend in the Y direction and first magnetic domains 911B which have a zigzag shape. Meanwhile, the magnet plate 910 has, as the second magnetic domains, second magnetic domains 912A which extend in the Y direction and first magnetic domains 912B which have a zigzag shape.

As illustrated in FIG. 14, in plan view, the first magnetic domains 911A are each made up of a column of a plurality of diamond-shaped magnetic domains that is arranged in the Y direction while sharing their respective vertices, whereas the second magnetic domains 912A are each made up of a column of a plurality of diamond-shaped magnetic domains that is arranged in the Y direction while sharing their respective vertices.

Meanwhile, in plan view, the magnetic domains are arranged in the X direction so that an order of a first magnetic domain 911A, a second magnetic domain 912A, a first magnetic domain 911B, a second magnetic domain 912A, a first magnetic domain 911A, and a second magnetic domain 912B is repeated.

With the arrangement, magnetic domain boundary lines 915 and 916 are provided. The magnetic domain boundary lines 915 and 916 extend in two directions of the zigzag shape of each of the first magnetic domain 911B and the second magnetic domain 912B.

As illustrated in FIG. 14, the entirety of a surface of the magnet plate 910 which surface faces the vapor deposition mask 120 (i.e., in plan view, the entire surface of the magnet plate) is a magnetically reversed region 913. This causes the entirety of the vapor deposition mask 120 to face the magnetically reversed region 913, so that mask strain can be more reliably prevented.

Assume here that as illustrated in FIG. 14, a region of the magnet plate 910 which region faces a region surrounded by (i) respective midpoints of two openings 122 which are adjacent to each other in the X direction and (ii) respective midpoints of two openings 122 which are adjacent, in the Y direction, to the respective two openings 122 which are adjacent to each other in the X direction is a unit region 918. In this case, a magnetic domain boundary line 915 and a magnetic domain boundary line 916 intersect each other in each unit region 918. In the each unit region 918, magnetic reversal occurs, across the boundary line 915 or the magnetic domain boundary line 916, at an intersection of (a) a line extending in the X direction, except a line passing through a center of the unit region 918, with (b) the magnetic domain boundary line 915 or the magnetic domain boundary line 916, so that magnetic reversal occurs a plurality of times. Meanwhile, in the each unit region 918, magnetic reversal occurs, across the boundary line 915 or the magnetic domain boundary line 916, at an intersection of (a) a line extending in the Y direction, except a line passing through the center of the unit region 918, with (b) the magnetic domain boundary line 915 or the magnetic domain boundary line 916, so that magnetic reversal occurs a plurality of times.

Further, unit regions 918 which are adjacent to each other in the Y direction have identical magnetic domain arrangements, whereas unit regions 918 which are adjacent to each other in the X direction have identical magnetic domain arrangements.

Thus, the magnet plate 910 has the magnetic domain boundary lines which are present in each of the X direction and the Y direction and whose number is equivalent to an integral multiple of the number of the openings 122. With the arrangement, according to the magnet plate 910, the number of times of occurrence of magnetic reversal in each of the X direction and the Y direction is equivalent to the integral multiple of the number of the openings 122.

The arrangement allows a repulsive force and an attractive force that are exerted on regions among all the openings 22 to be offset. Thus, (i) local mask strain occurring in units of openings 122 and (ii) mask damage can be prevented.

CONCLUSION

A vapor deposition device (1) in accordance with Aspect 1 of the present invention includes: a vapor deposition mask (20•120) having at least one opening; and a magnetic force generating source (magnet plate 10•110•210•310•410•510•810•910) for attracting the vapor deposition mask thereto by a magnetic force via a film formation target substrate (40), provided between the vapor deposition mask and the magnetic force generating source, so as to adsorb the vapor deposition mask onto the film formation target substrate, the magnetic force generating source having a plurality of magnetic domains (a first magnetic domain 11•111•311•411•811A•811B•911A•911B, a second magnetic domain 12•112•312•412•812A•812B•912A•912B) in plan view, the plurality of magnetic domains including adjacent magnetic domains that have at least one boundary line (magnetic domain boundary line 14•114) therebetween, the at least one boundary line being inclined to an opening side (26•126) of the at least one opening and being bent or curved, and the magnetic force generating source having magnetic fields that are generated in a respective plurality of different directions in plan view.

With the arrangement, the magnetic force generating source has a plurality of magnetic domains, and the plurality of magnetic domains includes adjacent magnetic domains that have at least one boundary line therebetween, the at least one boundary line being inclined to an opening side of the at least one opening. This allows a repulsive force and an attractive force that are exerted on regions of the vapor deposition mask which regions face each other across the at least one opening to be offset. With this, it is possible to prevent a change in shape of an opening (mask strain).

In a case where a boundary line between magnetic domains is a straight line, a boundary between magnetic properties is linear, and a magnetic force generating source has, on its surface, only a magnetic field that is generated in one direction. As a result, regions of a vapor deposition mask to which regions a load is applied are concentrated on the straight line. This may damage the vapor deposition mask.

In contrast, with the arrangement, the at least one boundary line is bent, and the magnetic force generating source has magnetic fields that are generated in a respective plurality of different directions in plan view. Thus, a region of the vapor deposition mask to which region a load is applied can foe distributed over lines that extend in a respective plurality of different directions. This allows a lighter load to be applied to the vapor deposition mask, so that the vapor deposition mask can be less damaged.

In Aspect 2 of the present invention, a vapor deposition device can be arranged such that, in Aspect 1 of the present invention, the at least one boundary line comprises a plurality of boundary lines that is present in a direction parallel to a direction in which a side of the at least one opening extends.

With the arrangement, since a plurality of boundary lines is present in a direction parallel to a direction in which a side of the at least one opening extends, magnetic reversal occurs in the magnetic domains a plurality of times in the direction parallel to a direction in which a side of the at least one opening extends.

The arrangement allows the magnetic force generating source to achieve a larger area of its magnetically reversed region in plan view, and makes it possible to more reliably prevent mask strain from occurring in the vapor deposition mask due to magnetization of the vapor deposition mask to a single magnetic pole.

In Aspect 3 of the present invention, a vapor deposition device can be arranged such that, in Aspect 1 or 2 of the present, invention, the at least one boundary line has a zigzag shape.

In Aspect 4 of the present invention, a vapor deposition device can be arranged such that, in Aspect 1 or 2 of the present invention, the at least one boundary line has a wave shape.

In Aspect 3 of the present invention, a vapor deposition device can be arranged such that: in Aspect 3 or 4 of the present invention, the magnetic force generating source has a magnetically reversed region (13•313•413) in which the adjacent magnetic domains mesh with each other; and the magnetically reversed region has an area that is not less than half an area of a surface of the magnetic force generating source which surface faces the film formation target substrate.

Since no magnetic reversal occurs in a region of the magnetic force generating source which region is different from the magnetically reversed region, a part of the vapor deposition mask which part faces the region may suffer from mask strain by being magnetized to a single magnetic pole.

In contrast, with the arrangement, the magnetically reversed region has an area that is not less than half an area of a surface of the magnetic force generating source which surface faces the film formation target substrate. This makes it possible to reliably prevent mask strain from occurring in the vapor deposition mask due to magnetization of the vapor deposition mask to a single magnetic pole.

In Aspect 6 of the present invention, a vapor deposition device can be arranged such that, in any one of Aspects 1 through 5 of the present invention, the plurality of different directions is three or more different directions.

With the arrangement, a region of the vapor deposition mask to which region a load is applied can be distributed over lines that extend in respective three or more different directions. This allows a lighter load to be applied to the vapor deposition mask, so that the vapor deposition mask can be less damaged.

In Aspect 7 of the present invention, a vapor deposition device can be arranged such that, in any one of Aspects 1 through 3 of the present invention, the plurality of magnetic domains is arranged in a lattice pattern.

With the arrangement, the magnetically reversed region occupies the entirety of the surface of the magnetic force generating source which surface faces the film formation target substrate. This makes it possible to more reliably prevent mask strain from occurring in the vapor deposition mask due to magnetization of the vapor deposition mask to a single magnetic pole.

In Aspect 8 of the present invention, a vapor deposition device can be arranged such that, in Aspect 7 of the present invention, the magnetic force generating source has the at least one boundary line (i) which is present in a direction parallel to a direction in which the opening side extends and (ii) whose number is equivalent to an integral multiple of the number of the at least one opening.

With the arrangement, the number of times of occurrence of magnetic reversal in a direction parallel to a direction in which the opening side extends is equivalent to an integral multiple of the number of the at least one opening. This allows a repulsive force and an attractive force that are exerted on regions among all the openings to be offset. Thus, (i) local mask strain occurring in units of openings and (ii) mask damage can be prevented.

In Aspect 9 of the present invention, a vapor deposition device cars, be arranged such that, in any one of Aspects 1 through 8 of the present invention, magnetic fields generated in respective at least any two of the plurality of different directions form therebetween an obtuse angle in plan view.

With the arrangement, since the at least one boundary line between the adjacent magnetic domains is acutely bent, the region of the vapor deposition mask to which region a load is applied can be distributed over a wider area. This allows a lighter load to be applied to the vapor deposition mask, so that the vapor deposition mask can be less damaged.

In Aspect 10 of the present invention, a vapor deposition device can be arranged such that, in any one of Aspects 1 through 9 of the present invention, the magnetic force generating source has a surface that faces the vapor deposition mask and is partially provided with no magnetic domain.

With the arrangement, the film formation target substrate and the vapor deposition mask can foe easily separated from each other. This makes it possible to prevent the vapor deposition mask from being damaged while an operation of the separation is being carried out.

In Aspect 11 of the present invention, a vapor deposition device can be arranged such that: in any one of Aspects 1 through 10 of the present invention, the vapor deposition mask has (i) an opening region (mask opening area 21) in which the at least one opening is provided at a given density and (ii) a non-opening region (27) in which no opening is provided; and the plurality of magnetic domains is arranged only in a region of the magnetic force generating source which region overlaps the opening region in plan view.

With the arrangement, the opening region and the film formation target substrate can be in closer contact with each other, and the film formation target substrate and the vapor deposition mask can be easily separated from each other.

A vapor deposition method in accordance with Aspect 12 of the present invention for forming a film of a given pattern on a film formation target substrate by use of a vapor deposition device mentioned in any one of Aspects 1 through 11 of the present invention, includes: a vapor deposition mask adsorbing step of adsorbing a vapor deposition m s onto the film formation target substrate by a magnetic force; and a vapor deposition material adhering step of adhering a vapor deposition material to the film formation target substrate via at least one opening of the vapor deposition mask.

The present invention is not limited to the embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

INDUSTRIAL APPLICABILITY

The present invention can be suitably used to produce, for example, an organic EL element and an inorganic EL element, an organic EL display device including the organic EL element, and an inorganic EL display device including the inorganic EL element.

REFERENCE SIGNS LIST

1 Vapor deposition device
10, 110, 210, 310, 410, 510, 810, 910 Magnet plate (magnetic force generating source)
11, 111, 311, 411 First magnetic domain (magnetic domain)
12, 112, 312, 412 Second magnetic domain (magnetic domain)
13, 313, 413, 813, 913 Magnetically reversed region
14, 114, 714, 815, 816, 817, 915, 916 Magnetic domain boundary line (boundary line)
20, 120 Vapor deposition mask
21 Mask opening area (opening region)
22, 122 Opening
26, 126 Opening side
27 Non-opening region
32 Vapor deposition material
40 Film formation target substrate

The invention claimed is:

1. A vapor deposition device comprising:
a vapor deposition mask having at least one opening; and
a magnetic force generating source for attracting the vapor deposition mask thereto by a magnetic force via a film formation target substrate, provided between the vapor deposition mask and the magnetic force generating source, so as to adsorb the vapor deposition mask onto the film formation target substrate,
the magnetic force generating source having a plurality of magnetic domains in plan view,
the plurality of magnetic domains including adjacent magnetic domains that have at least one boundary line therebetween, the at least one boundary line being inclined to an opening side of the at least one opening and being bent or curved, and
the magnetic force generating source having magnetic fields that are generated in a respective plurality of different directions in plan view.

2. The vapor deposition device as set forth in claim 1, wherein the at least one boundary line comprises a plurality of boundary lines that is present in a direction parallel to a direction in which a side of the at least one opening extends.

3. The vapor deposition device as set forth in claim 1, wherein the at least one boundary line has a zigzag shape.

4. The vapor deposition device as set forth in claim 1, wherein the at least one boundary line has a wave shape.

5. The vapor deposition device as set forth in claim 3, wherein:

the magnetic force generating source has a magnetically reversed region in which the adjacent magnetic domains mesh with each other, and the magnetically reversed region has an area that is not less than half an area of a surface of the magnetic force generating source which surface faces the film formation target substrate.

6. The vapor deposition device as set forth in claim 1, wherein the plurality of different directions is three or more different directions.

7. The vapor deposition device as set forth in claim 1, wherein the plurality of magnetic domains is arranged in a lattice pattern.

8. The vapor deposition device as set forth in claim 7, wherein the magnetic force generating source has the at least one boundary line (i) which is present in a direction parallel to a direction in which the opening side extends and (ii) whose number is equivalent to an integral multiple of the number of the at least one opening.

9. The vapor deposition device as set forth in claim 1, wherein magnetic fields generated in respective at least any two of the plurality of different directions form therebetween an obtuse angle in plan view.

10. The vapor deposition device as set forth in claim 1, wherein the magnetic force generating source has a surface that faces the vapor deposition mask and is partially provided with no magnetic domain.

11. The vapor deposition device as set forth in claim 1, wherein:

the vapor deposition mask has (i) an opening region in which the at least one opening is provided at a given density and (ii) a non-opening region in which no opening is provided; and the plurality of magnetic domains is arranged only in a region of the magnetic force generating source which region overlaps the opening region in plan view.

12. A vapor deposition method for forming a film of a given pattern on a film formation target substrate by use of a vapor deposition device recited in claim 1, comprising:

a vapor deposition mask adsorbing step of adsorbing a vapor deposition mask onto the film formation target substrate by a magnetic force; and a vapor deposition material adhering step of adhering a vapor deposition material to the film formation target substrate via at least one opening of the vapor deposition mask.

* * * * *